(12) United States Patent
Coteus et al.

(10) Patent No.: US 9,634,959 B2
(45) Date of Patent: Apr. 25, 2017

(54) HIGH-DENSITY, FAIL-IN-PLACE SWITCHES FOR COMPUTER AND DATA NETWORKS

(71) Applicant: International Business Machines Corporation, Armonk, NY (US)

(72) Inventors: Paul W. Coteus, Yorktown, NY (US);
Fuad E. Doany, Katonah, NY (US);
Shawn A. Hall, Pleasantville, NY (US);
Mark D. Schultz, Ossining, NY (US);
Todd E. Takken, Brewster, NY (US);
Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 14/548,345

(22) Filed: Nov. 20, 2014

(65) Prior Publication Data
US 2015/0289406 A1 Oct. 8, 2015

Related U.S. Application Data

(60) Provisional application No. 61/976,536, filed on Apr. 8, 2014.

(51) Int. Cl.
*H05K 7/18* (2006.01)
*H04L 12/933* (2013.01)
*H05K 7/20* (2006.01)

(52) U.S. Cl.
CPC ....... *H04L 49/109* (2013.01); *H05K 7/20254* (2013.01); *H05K 7/20572* (2013.01); *H05K 7/20763* (2013.01)

(58) Field of Classification Search
CPC ......... G06F 1/181; G06F 1/1656; G06F 1/187
USPC .......................... 361/736, 760, 784, 785, 792
See application file for complete search history.

(56) References Cited

U.S. PATENT DOCUMENTS

| | | | | |
|---|---|---|---|---|
| 4,547,795 A | * | 10/1985 | Wulff | H01L 22/32 257/665 |
| 5,167,511 A | * | 12/1992 | Krajewski | H01R 4/01 361/785 |
| 7,389,046 B1 | * | 6/2008 | Tanaka | H04J 14/0283 398/45 |
| 8,103,137 B2 | * | 1/2012 | Kirkpatrick | H04Q 11/0005 385/17 |
| 8,406,128 B1 | | 3/2013 | Brar et al. | |

(Continued)

FOREIGN PATENT DOCUMENTS

WO 2013165390 A1 11/2013

OTHER PUBLICATIONS

Pending U.S. Appl. No. 61/976,536, entitled: "High-density, fail-in-place switches for computer and data networks", filed Apr. 8, 2014.

(Continued)

*Primary Examiner* — Dion R Ferguson
*Assistant Examiner* — Mandeep S Buttar
(74) *Attorney, Agent, or Firm* — L. Jeffrey Kelly

(57) ABSTRACT

A structure for a network switch. The network switch may include a plurality of spine chips arranged on a plurality of spine cards, where one or more spine chips are located on each spine card; and a plurality of leaf chips arranged on a plurality of leaf cards, wherein one or more leaf chips are located on each leaf card, where each spine card is connected to every leaf chip and the plurality of spine chips are surrounded on at least two sides by leaf cards.

5 Claims, 40 Drawing Sheets

(56) References Cited

U.S. PATENT DOCUMENTS

| | | |
|---|---|---|
| 8,532,086 B1 | 9/2013 | Genetti et al. |
| 2002/0182899 A1* | 12/2002 | Debord .................... H05K 1/14 439/65 |
| 2007/0002536 A1* | 1/2007 | Hall .......................... G06F 1/20 361/695 |
| 2007/0109831 A1 | 5/2007 | RaghuRam |
| 2011/0286691 A1* | 11/2011 | Hopkins .................. G02B 6/43 385/14 |
| 2012/0151090 A1 | 6/2012 | Nakashima et al. |
| 2012/0230182 A1 | 9/2012 | Southworth et al. |
| 2013/0156425 A1 | 6/2013 | Kirkpatrick et al. |

OTHER PUBLICATIONS

Bogdanski et al., "Multi-homed fat-tree routing with InfiniBand", 2014 22nd Euromicro International Conference on Parallel, Distributed, and Network-Based Processing, IEEE, CPS Conference Publishing Services, pp. 122-129.

* cited by examiner

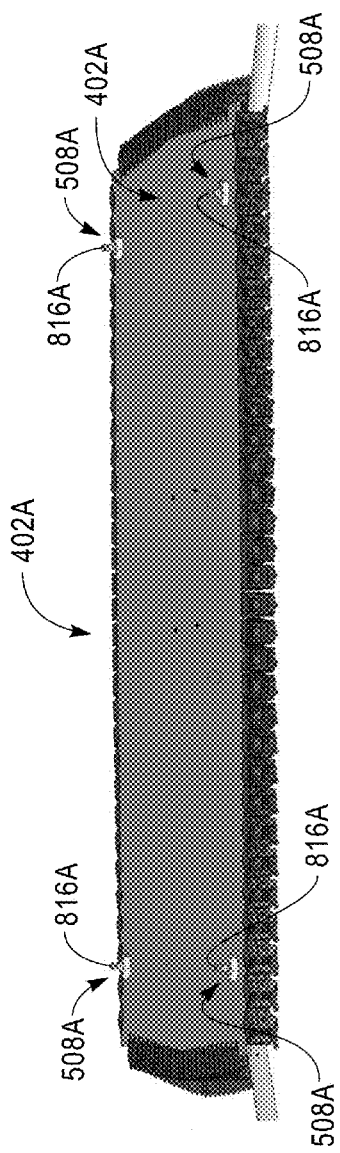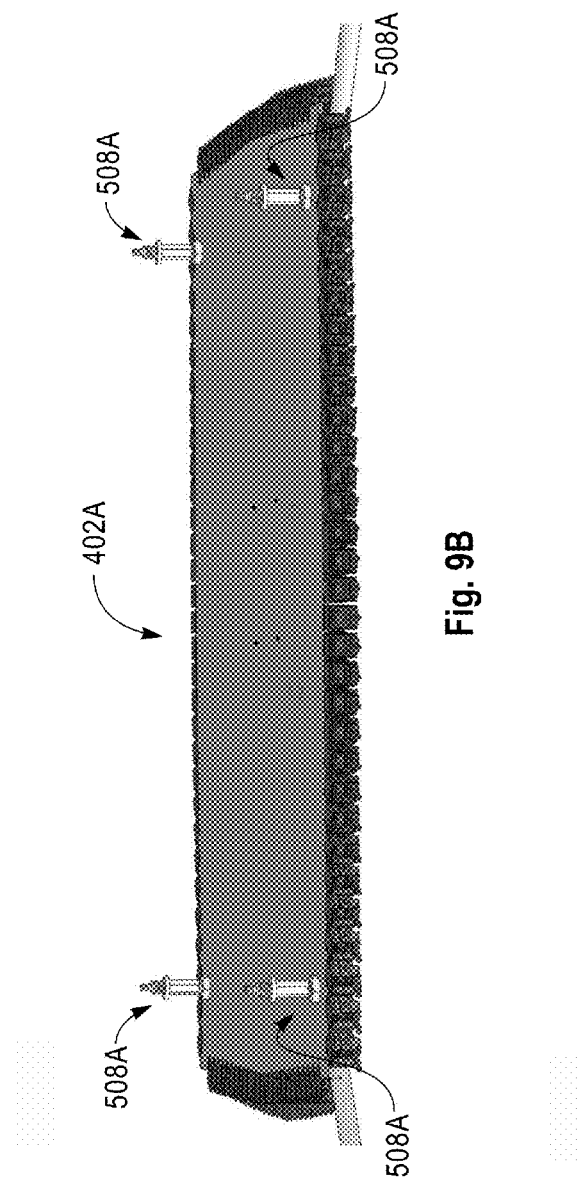

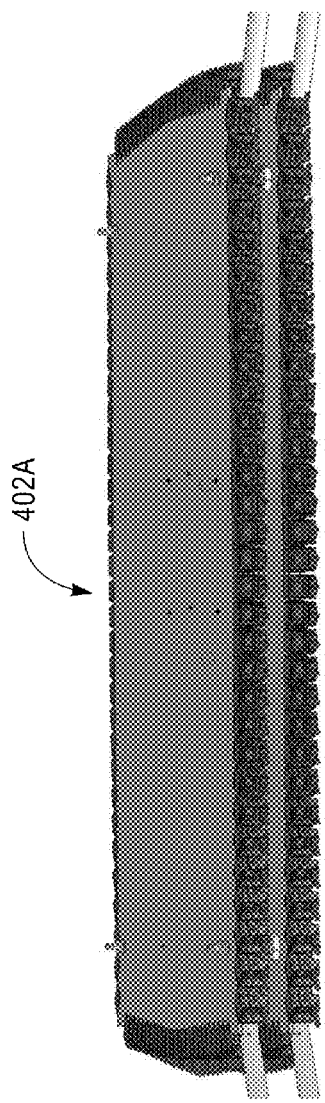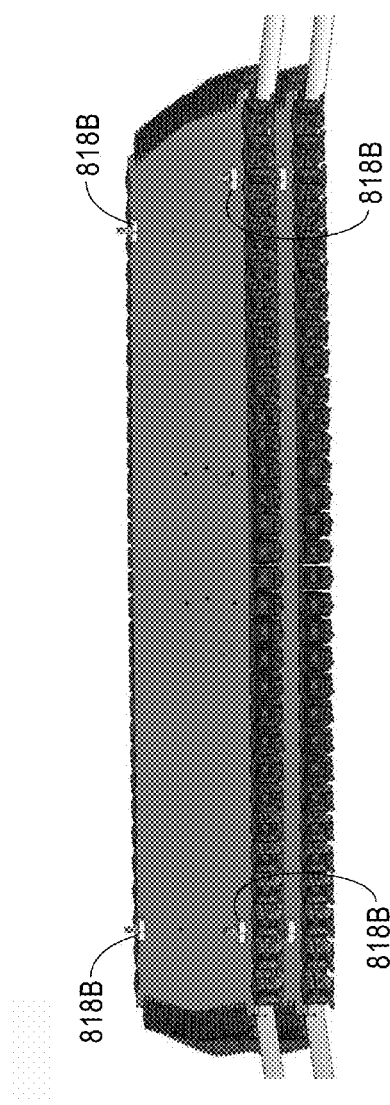

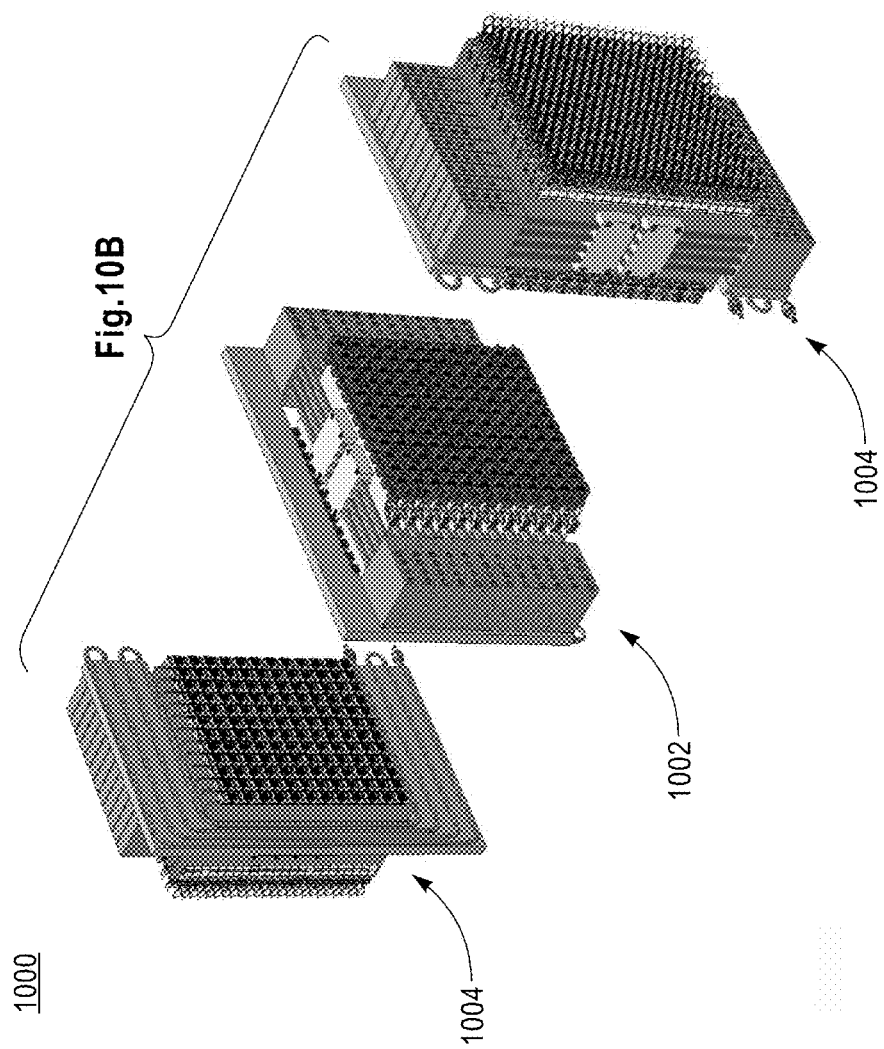

HIGH-DENSITY, FAIL-IN-PLACE SWITCHES FOR COMPUTER AND DATA NETWORKS

STATEMENT REGARDING FEDERALLY SPONSORED RESEARCH OR DEVELOPMENT

This invention was made with United States Government support under contract B601996 awarded by U.S. Department of Energy. The Government has certain rights to this invention.

BACKGROUND

The present invention generally relates to network switches, and more particularly to the architecture and structure of a network switch having leaf cards surrounding spine cards on at least two sides.

Modern computer systems have sophisticated networks, either custom or based on evolving network standards. Although some systems have processing nodes that are self-interconnected (e.g., the IBM Blue Gene line of computers), most systems are based on cabling the computing or storage elements of the system into a network comprised of external switches or routers. In the industry, a switch connects a set of networked components into a local-area network, whereas a router connects sets of local-area networks. The places where cables are attached are called ports. For the present invention, switches and routers may be referred to as network switches.

Switches are based on switch chips. Switch chips for Ethernet or Infiniband, two popular standards, are typically built of CMOS. For example, an Ethernet switch comprising 48 places, with each place allowing data to be sent and received at a data rate of 10-Gigabits-per-second, is referred to as a "48-port, 10-Gb/s switch". Another example is a 36-port, 56-Gigabit-per-second-per-port Infiniband switch, which has 36 places where data can be sent and received as 4 parallel lanes, each at 14 Gb/s.

SUMMARY

According to one embodiment of the present invention, a structure for a network switch is provided. The structure may include a plurality of spine chips arranged on a plurality of spine cards, wherein one or more spine chips are located on each spine card; and a plurality of leaf chips arranged on a plurality of leaf cards, wherein one or more leaf chips are located on each leaf card, wherein each spine card is connected to every leaf chip and the plurality of spine chips are surrounded on at least two sides by leaf cards.

According to another embodiment of the present invention, a structure for a network switch is provided. The structure may include a set of leaf assemblies connected to a set of spine assemblies, the leaf assemblies include a leaf card and leaf chips, the spine assemblies include a spine card and spine chips, wherein every leaf assembly is connected to every spine assembly and the leaf assemblies surround the spine assemblies on at least two sides.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 9A-9E are illustrations of methods of attaching two or more cards, according to an embodiment.

FIGS. 10A and 10B are illustrations of a liquid-cooled spine array, according to an alternative embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
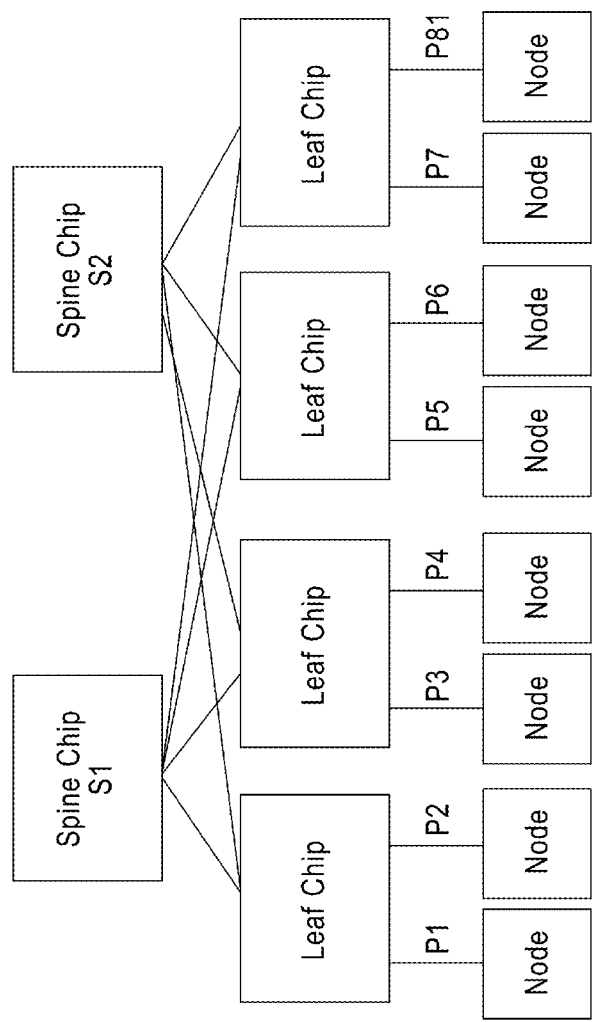
FIG. 1 is an illustration of prior art showing the orientation of a two layer network.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring now to FIG. 1 (prior art), a focus is on very large switches (i.e., core switches or director switches). The number of ports in a typical core switch can vastly exceed the number of ports in a switch chip. A popular configuration is a two-layer network, where the two-layer network is arranged in a spine-leaf topology, as illustrated.

Each of a first set of switch chips is called a leaf chip and each leaf chip has $p_L$ ports. Four leaf chips are illustrated and each leaf chip has four ports (i.e., $p_L=4$). Typically, in a core switch, the leaf chips are placed on a plurality of circuit cards, often called line cards or leaf cards. Generally, each leaf chip has externally facing ports equal to $p_L/2$ connected on a first edge of the leaf card to cables running to external computer elements (i.e., nodes), such as, for example, a processor or a storage node. There also may be internally facing ports equal to $p_L/2$ connected through leaf-to-spine connectors located on a second edge of the leaf card to a second set of switch chips called spine chips, such as, for example, spine chip S1 and spine chip S2. The spine chips are illustrated as having $p_S$ ports. Typically, spine chips and leaf chips are identical, where $p_S=p_L=p$. One or more spine chips are typically placed on a circuit card called a spine card. Every port of every spine chip is connected to an internally facing port of a leaf chip. Consequently, the maximum number of externally facing ports ($P_{ext}$) in a two-layer core switch may be computed as follows.

Let:

$N_L$=Number of leaf chips in the core switch (1)

$N_S$=Number of spine chips in the core switch (2)

$p_L$=Number of ports per leaf chip (3)

$p_S$=Number of ports per spine chip (4)

$P_{ext}$=Total number of externally facing ports for the core switch (5)

Because one port of each spine chip must connect to a port on a leaf chip, it follows that:

$N_L=p_S$ (6)

For a non-blocking switch, only half of the leaf chip ports are externally facing, it follows that:

$P_{ext}=N_L*p_L/2$ (7)

Substituting (6) into (7) yields:

$P_{ext}=p_S*p_L/2$ (8)

When spine chips are identical to leaf chips, it follows that:

$p_S=p_L=p$ (9)

$P_{ext}=p^2/2$ (10)

Because the total number of internally facing ports on the leaf chips, $N_L*p_L/2$, must equal the total number of ports $N_S*p_S$ on the spine chips, it follows also that:

$N_S=N_L*p_L/(2*p_S)$ (11)

whence, for the special case (9), it follows that:

$N_S=N_L/2$ (12)

For the example above, where the special case (9) with p=48, a non-blocking core switch has $P_{ext}$=1152 externally facing ports according to equation (10).

Figure 2A:
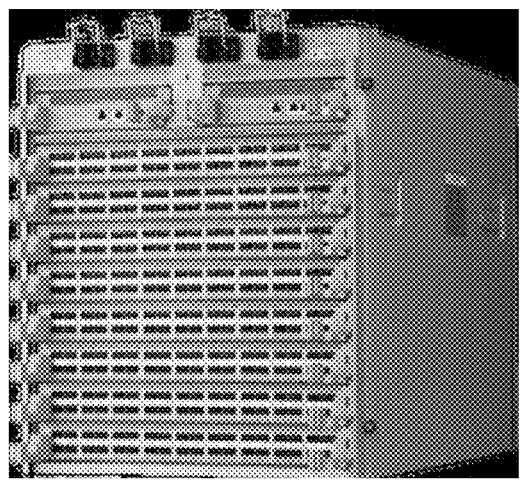
FIGS. 2A and 2B are illustrations of prior art showing a modern core switch.
Figure 2B:
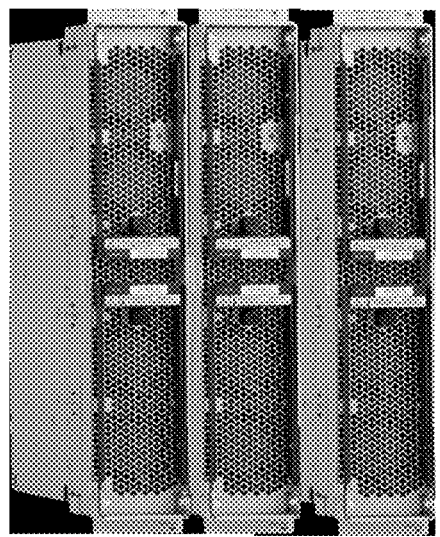

Referring now to FIGS. 2A and 2B, a modern core switch is housed in an air-cooled rack, where the modern core switch has 1152 externally facing ports. Leaf cards may be connected on a first side of the rack (e.g., a front side) and spine cards may be connected on a second side of the rack (e.g., a back side). The spine cards may be vertical while the leaf cards may be horizontal, but other orientations may be used. This may be a typical approach because every leaf chip has a connection to every spine chip.

A limitation of the current approach is that the maximum value of $P_{ext}$, that can be economically packaged, is often smaller than the number of devices desired for interconnection. For example, economic packaging of a 10GBASE-T Ethernet is accomplished using inexpensive RJ45 connectors and low-cost category-6 electrical cables, but these inexpensive components are bulky, so a small number of leaf cards can accommodate only a modest value of $P_{ext}$. To achieve larger values of $P_{ext}$, expensive alternative components are often used, such as a QSFP. A QSFP can accept four-channel-wide optical cables, which, for 10G Ethernet, must be connected to computing or storage nodes using expensive 1-to-4 optical breakout cables.

The fact that $P_{ext}$ is limited by packaging constraints is further aggravated by the development of new, faster switch chips with larger p values. The higher speed of the port can be handled by appropriate IO cell design, proper high-speed electrical packaging techniques, and use of commensurately faster cables. However, because the number of externally facing ports $P_{ext}$ in a two-level fat-tree is quadratic in p, as stated by equation (10), the problem of packaging a core switch becomes dramatically more difficult as p increases.

In some switches, a port is implemented by a single electrical channel. For example a 10 Gb/s Ethernet port might be made by two differential wiring pairs, one receiving data and one sending data, carried on so-called twin-axial electrical cable. In other switches, a port may be implemented optically: using optical transceivers, the same 10 Gb/s signals may be sent over a pair of optical fibers, one sending data and one receiving data. Such a pair of signals is called a lane. A port can also include multiple lanes. If the signaling rate is 25 Gb/s per lane, these four lanes can deliver, in parallel, 100 Gb/s per port. There is a new Ethernet standard that also uses 4 parallel lanes at 25 Gb/s. Assessment of the limits of packaging and chip technology suggests that 64 port chips, each with four lanes, are possible with today's technologies.

Figure 3:
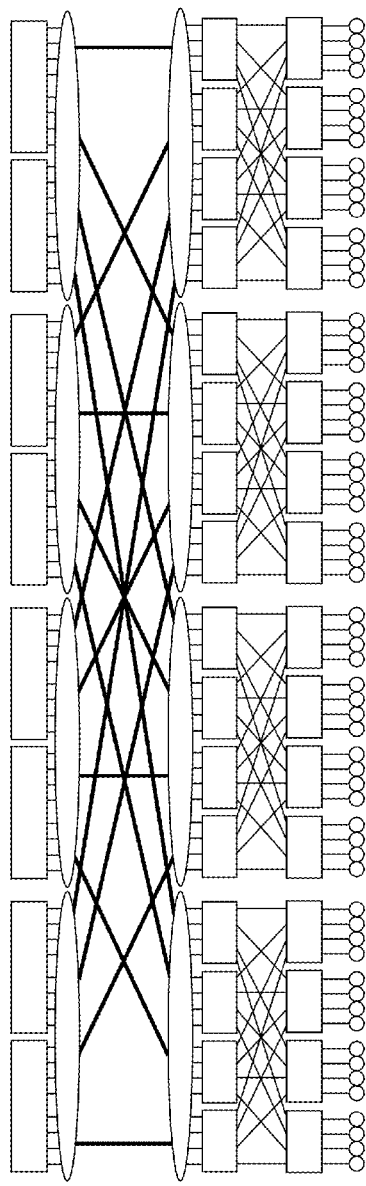
FIG. 3 is an illustration of prior art showing the orientation of a three layer network.

Referring now to FIG. 3, packaging constraints as $P_{ext}$ increases become even more acute for a three-level network, where p=8. For such three-level networks, the number of externally facing ports can be tens of thousands. For example, with p=48, a switch that implements such a three-level network (m=3) has $2(p/2)^m=27,648$ externally facing ports.

Equation (10) applies for non-blocking switches, in which only half of a leaf switch's ports are externally facing, such that all cable ports may send or receive data at full bandwidth without slowdown. A more popular structure includes oversubscribed switches, in which there are more leaf cards than there are spine cards to support them at full bandwidth. In other words, the fraction of a leaf switch's ports that are externally facing is greater than ½.

Let:

f=Fraction of a leaf switch's ports that are externally facing.

Then equation (7) generalizes to:

$$P_{ext}=f*N_L*p_L \quad (13)$$

Substituting (6) into (13) yields:

$$P=f*p_S*p_L \quad (14)$$

Consequently, for the typical case (9) (i.e., $p_S=p_L\equiv p$), it follows that:

$$P_{ext}=f*p^2 \quad (15)$$

Because the total number of internally facing ports on the leaf chips, $(1-f)*N_L*p_L$, must equal the total number of ports $N_S*p_S$ on the spine chips, it follows also that:

$$S=(1-f)*N_L*p_L/p_S \quad (16)$$

whence, for the special case (9), it follows that:

$$N_S=(1-f)*N_L \quad (17)$$

In an example, f=¾. Then, for special case (9), $P_{ext}=0.75*p^2$. f greater than ½ may yield data collisions if more than ½ of the nodes connected to the leaf cable ports want to send or receive data at once. However, such collisions seldom, if ever, occur, accounting for the popularity of the over-subscribed switches.

As indicated by equation (15), the number of externally facing ports $P_{ext}$ for over-subscribed switches (f>½) is greater than stated by the previous examples of non-blocking switches (f=½). For example, for p=48 with f=¾, equation (15) gives $P_{ext}=1728$.

Today there are data centers with tens of thousands of nodes, many more nodes than can be connected by existing core switches. That situation is handled by cascading core switches in various ways to make larger switches. This comes at the cost of more cables and switches, more power for serialization-deserialization (SERDES) at each cable connection, and additional latency to move through the extra switches, cables, and SERDES stages.

In some switches the spine and leaf cards can be concurrently maintained, and there can be an extra spine card. If a spine cards fails, data is routed to other spine cards, and the faulty spine card can be replaced without turning off the switch, which continues to route data. If a leaf card fails then the compute or storage nodes connected to them are lost from the network, but modern data centers are designed to tolerate the failure of a compute or storage node, so that is typically acceptable.

A new packaging architecture for obtaining very-large-port-count network switches and obtaining a large value of $P_{ext}$ is described below. The architecture is based on the idea that leaf-to-spine connections in a fat-tree are inherently redundant. For example, in FIG. 1, which is a two-level fat tree with p=4, $N_L=4$, $N_S=2$, $P_{ext}=8$, if spine chip S1 fails, all externally facing ports P1-P8 can still communicate with each other through spine chip S2. If the number $N_S$ of spine chips is large, as in modern core switches, the throughput of the switch will be only slightly degraded each time a spine chip fails; consequently, failure of a few spine chips is hardly noticeable, because there are still many paths through the network.

The proposed, large-$P_{ext}$ packaging architecture deliberately exploits the aforesaid redundancy: it allows spine ports or even entire spine chips to fail without replacement, a strategy called "fail in place". Where, under normal conditions, if a port on a spine chip, or even the entire spine chip, fails, it is not repaired. Rather, traffic is redirected to the other, working spine ports. Despite the failure, there is still connectivity between all cable ports; the throughput of the switch is merely reduced. If $N_S$ is large, this throughput reduction is minimal. For example, for the previously mentioned switch chip having p=104 ports, there are $N_S=p/2=52$ spine chips and $N_S*p=52*104=5408$ spine ports. The loss of a few of these ports, the likely cost of the large-$P_{ext}$ packaging architecture proposed herein, is acceptable in exchange for the much-larger benefits afforded thereby. That is, compared to the large-$P_{ext}$ alternative of combining smaller core switches to make larger ones, the large-$P_{ext}$ architecture may provide three benefits: first, reduced power because there are fewer SERDES (serializer/deserializer) channels; second, lower latency because there are fewer "hops through switch chips"; and third, reduced cost because there are fewer cables.

The large-$P_{ext}$ packaging architecture can achieve up to a four-fold increase in $P_{ext}$ compared to current switches. That is, because the spine cards are never removed for the lifetime of the switch, they may be surrounded by leaf cards on multiple sides rather than on only one side. Thus, compared to current architecture where leaf cards are connected to spine cards on the front only, the number of leaf chips $N_L$, and hence the number of externally facing ports $P_{ext}$, can be doubled if the leaf cards are connected to two edges of each spine card. Similarly, compared to current architecture, the number of externally facing ports $P_{ext}$ can be quadrupled if leaf cards are connected to all four edges of each spine card. Embodiments achieving large $P_{ext}$ by exploiting the fail-in-place strategy.

Figure 4A:
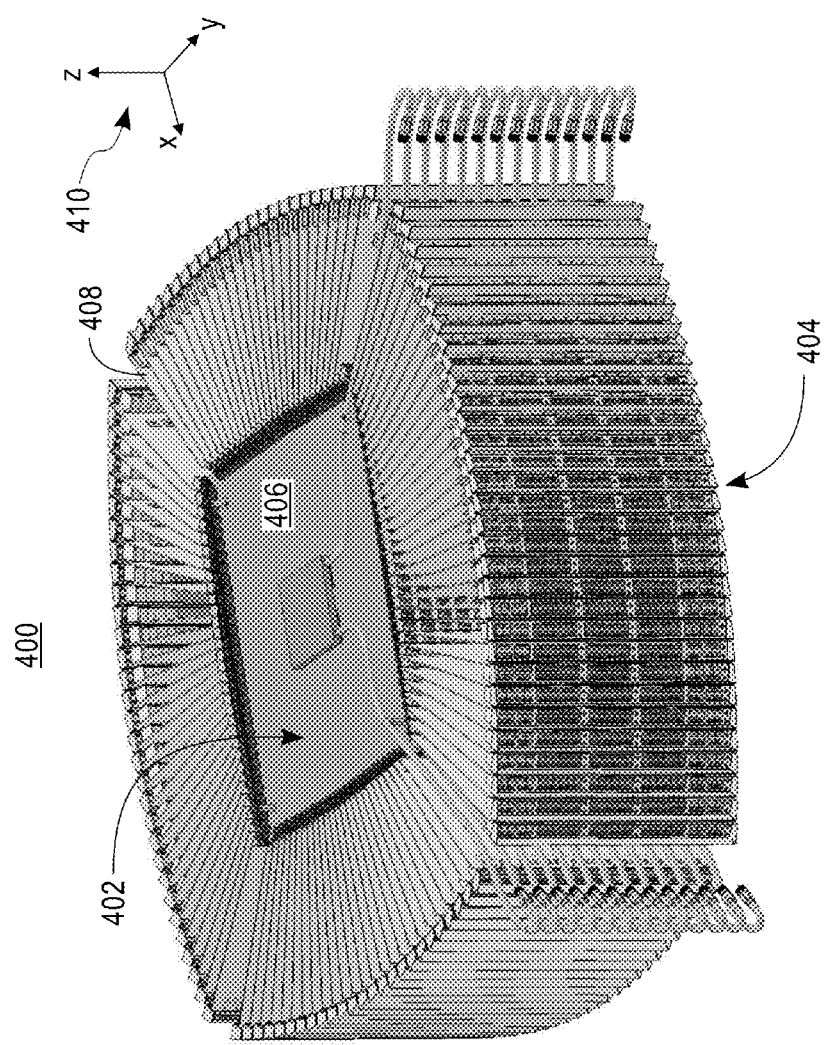
FIGS. 4A-4E are illustrations of a spine-and-leaf array, according to an embodiment.

Referring now to FIG. 4A, an embodiment of a spine-and-leaf array 400 with fail-in-place spines includes a central stack of $n_S$ spine assemblies 402 and a peripheral array of $n_L$ leaf assemblies 404, where $n_S$ and $n_L$ are integers. The spine assemblies 402 may include a spine card 406, such as, for example, a printed circuit board (PCB), and the leaf assemblies 404 may include a leaf card 408.

Integers $n_S$ and $n_L$ are related to the previously defined integers $N_S$ and $N_L$, where:

$$N_S=n_S*k_S \text{ and } N_L=n_L*k_L \quad (18)$$

$$k_S=\text{Number of switch chips per spine card} \quad (19)$$

$$k_L=\text{Number of switch chips per leaf card} \quad (20)$$

In embodiments illustrated in FIGS. 4A-9E:

$$n_S=13; k_S=4; N_S=52 \quad (21)$$

$$n_L=104; k_L=1; N_L=104 \quad (22)$$

The switch chip on both spine and leaf cards has p=104 ports. The spine-and-leaf array 400 achieves:

$$P_{ext}=p^2/2=5408 \quad (23)$$

In the illustrated embodiment, there are 112 cards shown, 104 of which may be leaf assemblies 404 and the remaining cards may be power cards, spine-control cards and/or leaf-control cards. Power, spine-control, and leaf-control are redundant, such that global failure never occurs from failure of one component, or even from failure of several components. In the illustrated embodiment, if fewer than eight peripheral power and control cards are needed, then peripheral cards nearest the corners of the array may be eliminated.

The spine-and-leaf array 400 may be the heart of a core switch, but the switch may also include mechanical and cooling infrastructure (e.g., water cooling infrastructure). Spine assemblies 402 are linearly arrayed at a spine-to-spine pitch H along a z-direction of coordinate system 410, and the leaf assemblies 404 are circumferentially arrayed around the stack of spine assemblies 402, such that each leaf assembly 404 may be electrically or optically connected to each spine assembly 402.

In an embodiment, the central stack may include one or more central leaf-control assemblies (not illustrated) in addition to the $n_S$ spine assemblies 402. Each central leaf-control assembly may be similar in size, shape and orientation to the spine assembly 402, but may include electronics (instead of spine chips) for initializing and controlling the peripheral array of leaf assemblies 404. An alternative embodiment, an initialization and control function for leaf cards may be provided by one or more peripheral leaf-control assemblies (not illustrated). Each peripheral leaf-control assembly may be similar in size, shape and orientation to a leaf assembly 404, but may include electronics (instead of leaf chips) for initializing and controlling the leaf assemblies 404. In the illustrated embodiments shown in FIGS. 4-9, such peripheral leaf-control assemblies may occupy some number of the eight extra peripheral-card positions discussed above following equation (23). In an embodiment, redundancy of the leaf-control function may be provided, such that global failure does not occur from failure of one component or several components.

Figure 4B:
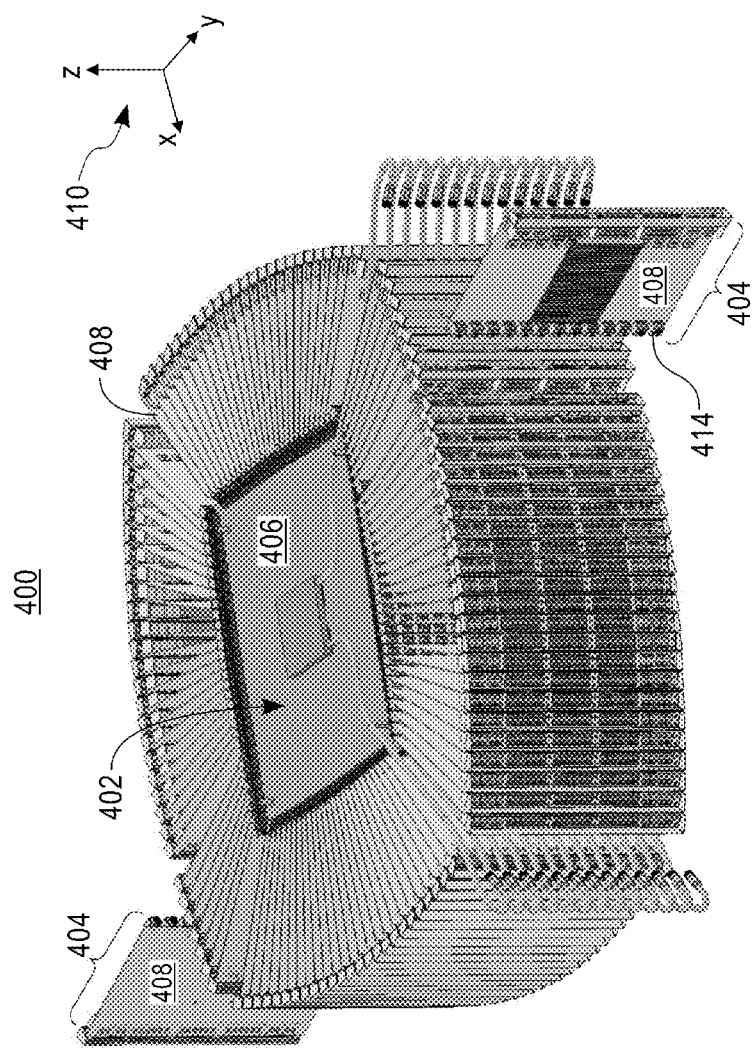

Referring now to FIG. 4B, each leaf assembly 404 may be disconnected from the spine assemblies 402. Two leaf assemblies 404 are illustrated as being removed to illustrate the disconnection. However, removal of the spine assembly 402, for example, to replace a failed spine chip, would be very laborious because all $n_L$ leaf cards 408 may need to be disconnected followed by the spine assemblies 402 to reach a target spine card. This is a benefit to the "fail in place" concept explained above (e.g., no spine cards will ever be removed).

Figure 4C:
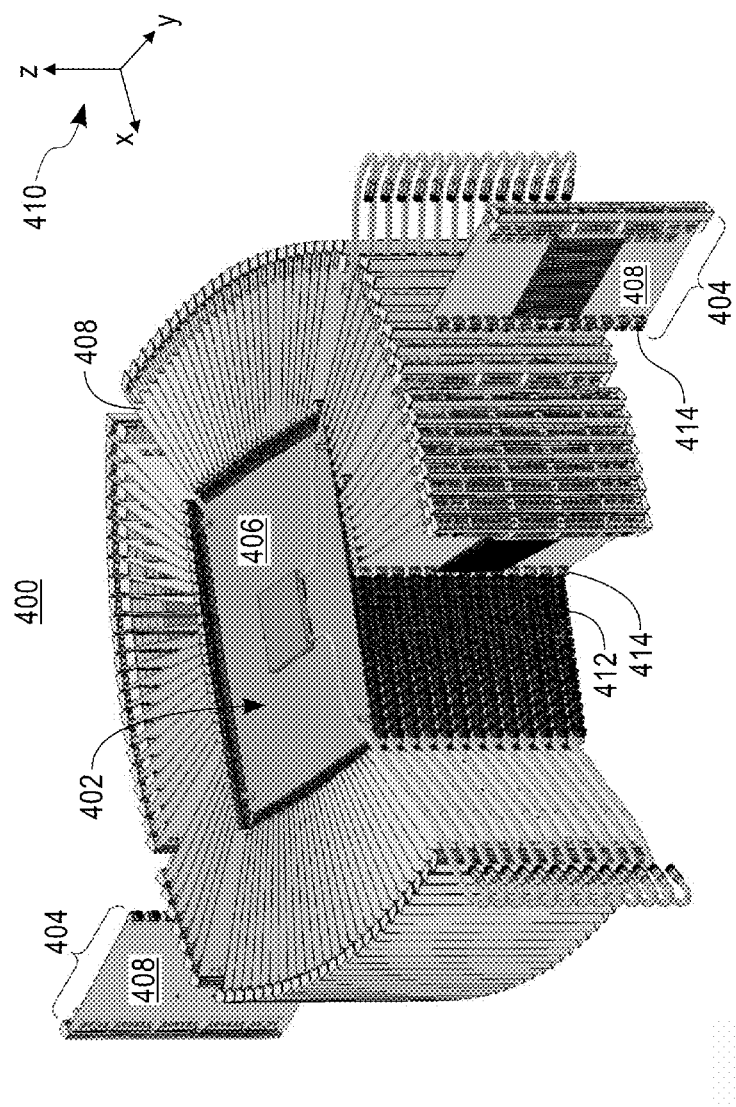
Figure 4D:
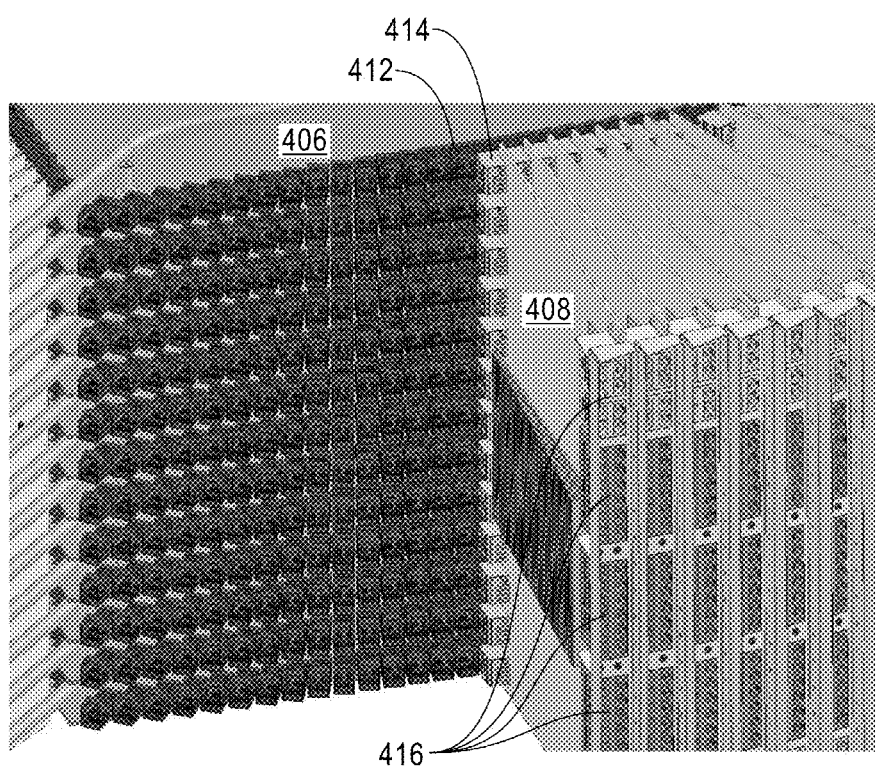

Referring now to FIGS. 4C and 4D, a section of leaf assemblies 404 are hidden to illustrate the electrical connection between the spine assemblies 402 and the leaf assemblies 404. At each of the $n_S*n_L$ intersections between the spine card 406 and the leaf card 408, electrical connection is provided by an orthogonal header 412 affixed to the spine card 406 and a mating orthogonal receptacle 414 affixed to the leaf card 408. When a leaf card 408 is connected, $n_S$ of these header-to-receptacle connections are simultaneously made.

Figure 4E:
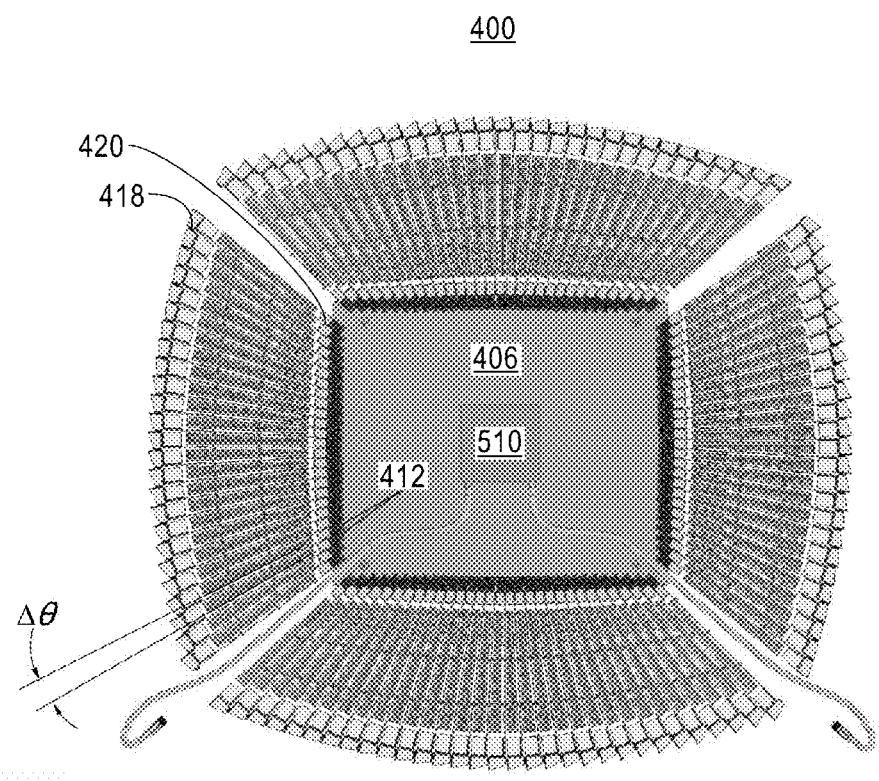

Referring now to FIG. 4E, which is a top view of the spine-and-leaf array 400, the assembly shown achieves a large number of leaf cards ($n_L$=104), as well as eight additional peripheral cards for power and management, with a relatively small spine card (23"×27"=584×686 mm). Large $n_L$ may be desirable to achieve large Pert, which may be desirable for reasons explained above. In this embodiment, a small spine card may be desirable for two reasons. First, the degradation of high-speed electrical signals in a PCB is a strong function of the distance that the signals must travel therein. Second, economical manufacture of PCBs is limited to a certain maximum size, which is currently about 23" by 27" (584×686 mm).

To achieve large $n_L$ with a spine card having limited perimeter, adjacent headers 412 should be close together. However, if the headers 412 were close together and leaf cards were parallel, the space between leaf cards would be too small to accommodate the appropriate number of external connectors (e.g., dual-stacked RJ-45 connectors 416 illustrated in FIG. 4D) that must be packaged at the distal edges 418 of the leaf cards. In this embodiment, the leaf cards are "flared" rather than parallel. The leaf cards are further apart at their distal edges than at their proximal edges 420, because there is an angle $\Delta\theta$ between adjacent cards. Means to achieve $\Delta\theta$ without compromising the perimeter of the spine card and thereby limiting $n_L$. An integrated cold-plate 510 may also be used, described below.

Figure 5A:
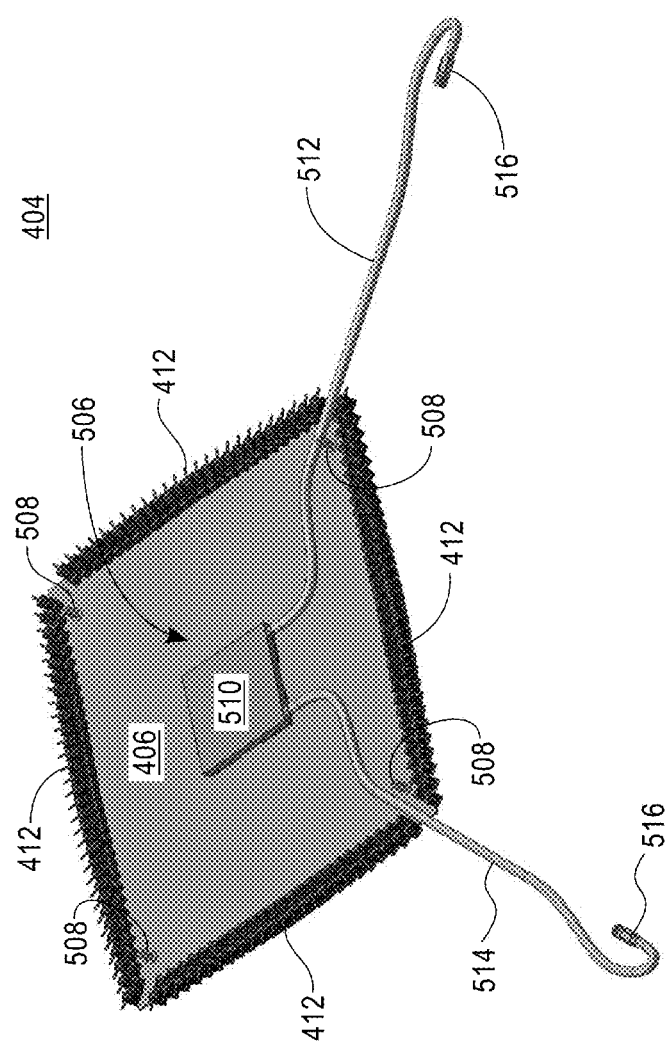
FIGS. 5A-5E are illustrations of a single spine assembly, according to an embodiment.
Figure 5B:
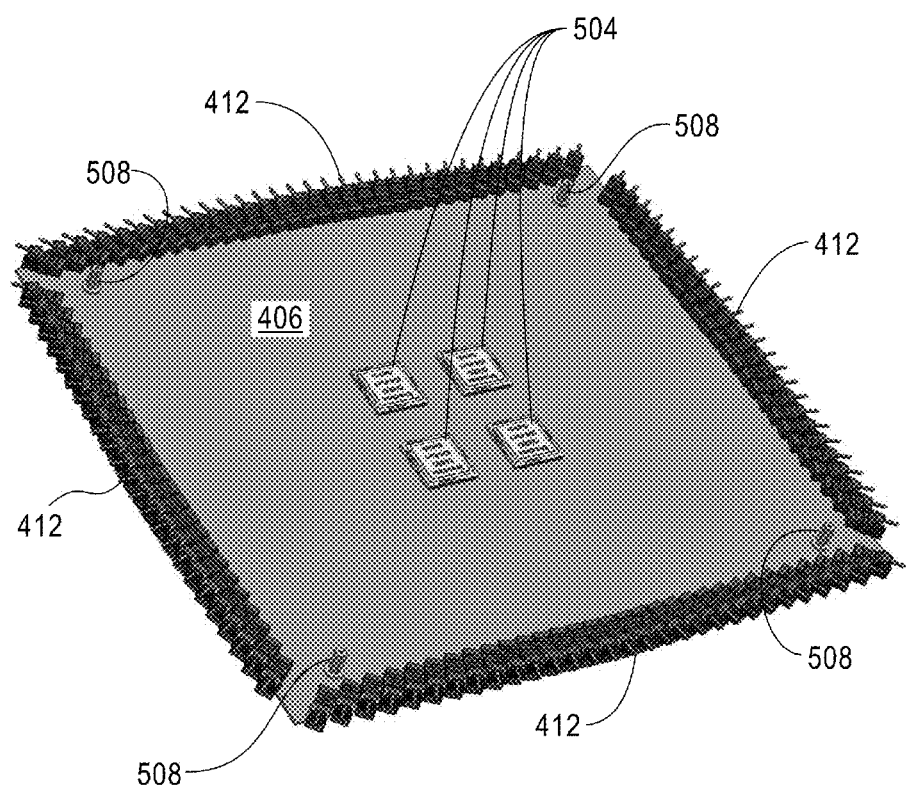

Referring now to FIGS. 5A and 5B, a spine-card assembly 404 includes, in addition to spine card 406 (illustrated in FIG. 4), an $n_L$-fold array of the orthogonal headers 412 to convey electrical signals between the spine card and leaf cards, a $k_S$-fold array of switch chips 504, cooling means 506 to remove heat from switch chips 504, and standoffs 508 to guarantee that the spine-to-spine pitch H is achieved despite manufacturing variations in thickness of the spine cards 408. In the illustrated embodiment, the cooling means includes the liquid-cooled cold plate 510, a supply hose 512 and a return hose 514 whose proximal ends are connected thereto, and appropriate plumbing 516 to connect the distal ends of supply hose 512 and return hose 514 to a liquid-cooling supply and a liquid-cooling return, respectively. The cooling means 506 is hidden in FIG. 5B to reveal the switch chips 504. The spine-card assembly may further include additional elements, such as, for example, a processor and memory node (not illustrated).

Figure 5C:
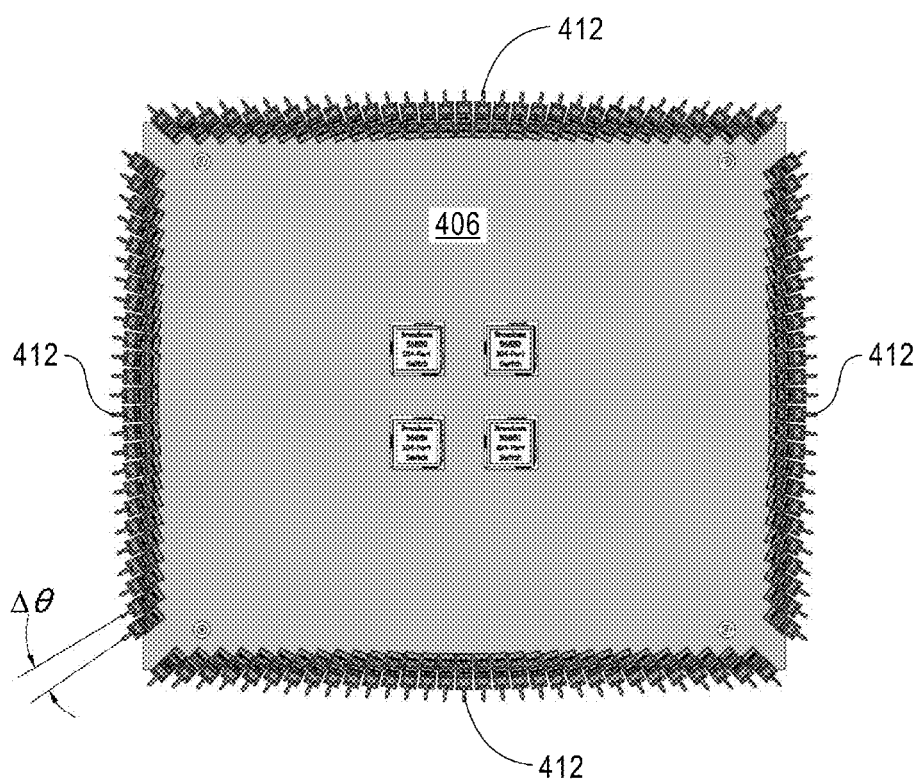

Referring now to FIG. 5C, which is a top view of a spine-card assembly, an arrangement of orthogonal headers 412 is shown. As described above, this arrangement produces a leaf-card spreading angle $\Delta\theta$ subtended between adjacent leaf cards and may not sacrifice spine-card perimeter.

Figure 5D:
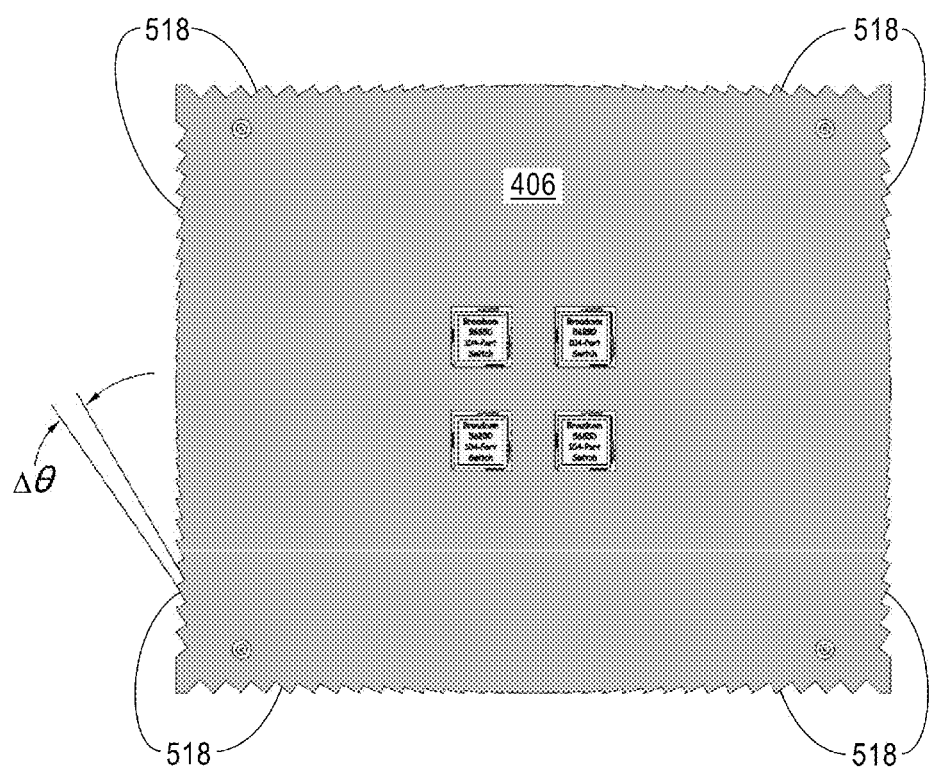
Figure 5E:
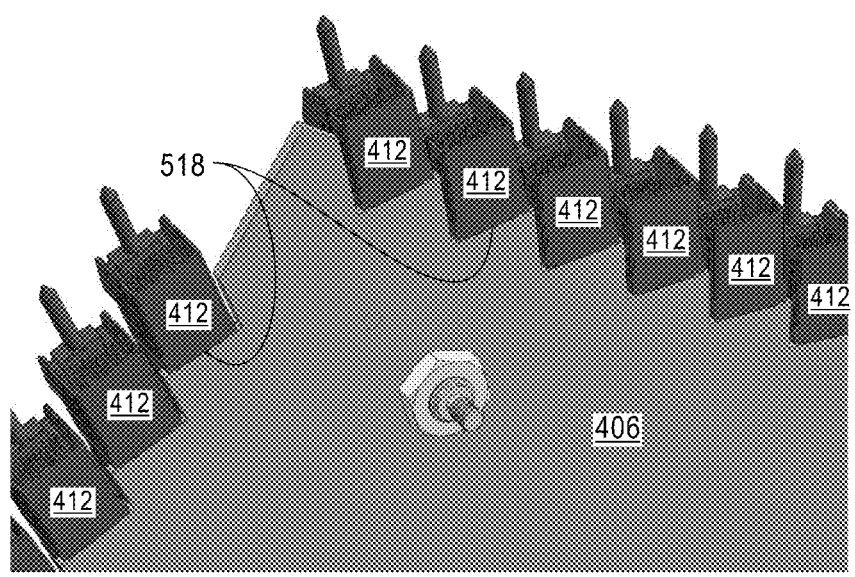

Referring now to FIGS. 5D and 5E, the arrangement of orthogonal headers 412 is achieved by a saw-toothed serration 518 along the perimeter of the spine card 406. The angle between adjacent facets of the serration is the leaf-card spreading angle $\Delta\theta$. Each orthogonal header 412 abuts one of the facets, as illustrated in FIG. 5E, which is a view from the bottom surface of the spine card 406. The saw-toothed serration 518 is superior to simple polygonal facets, because polygonal faceting of the north and south edges of the card would shorten the perimeters of the east and west edges, and vice versa. In contrast, the saw-toothed facets 518 do not shorten the perimeter; consequently, they achieve the large possible value of $n_L$ for the given size of spine card.

Figure 6A:
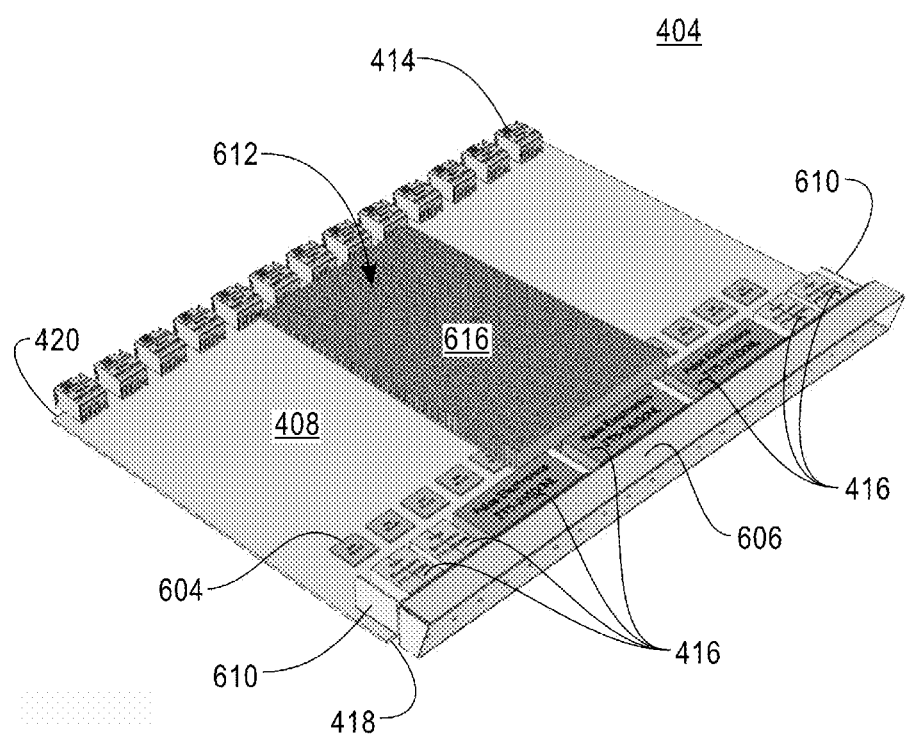
FIGS. 6A-6F are illustrations of leaf assemblies, according to an embodiment.
Figure 6B:
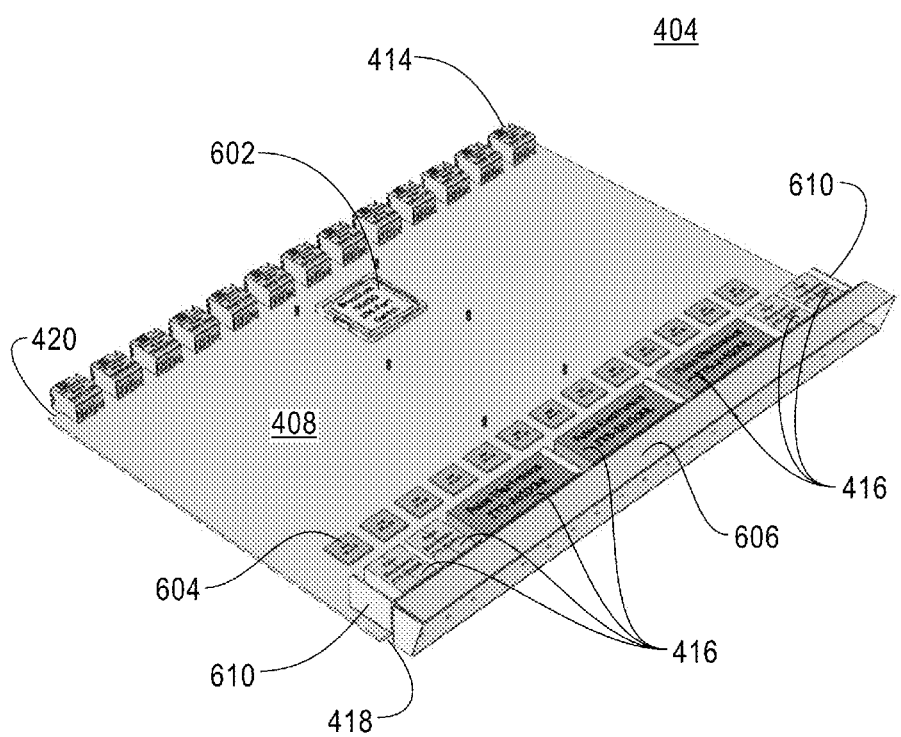
Figure 6C:
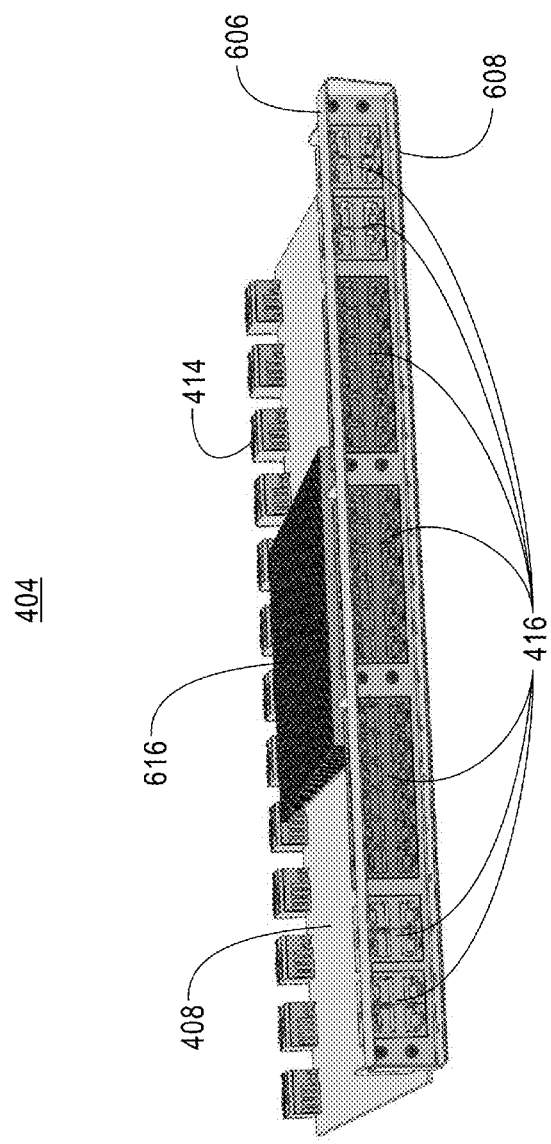
Figure 6D:
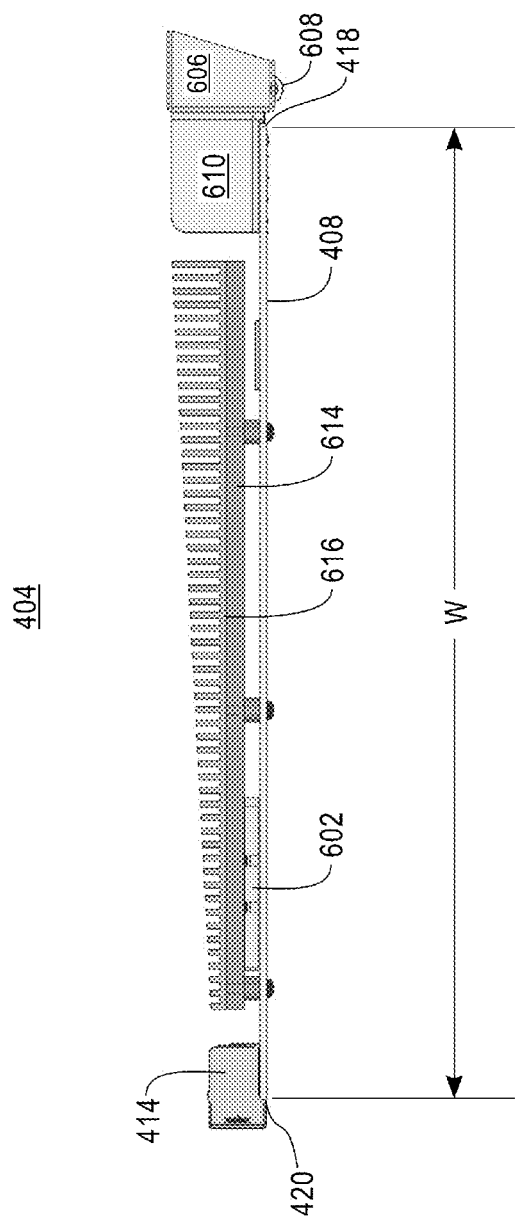

Referring to FIGS. 6A-6D, leaf-card assembly 404 includes, in addition to the leaf card 408, an $n_S$-fold array of orthogonal receptacles 414, a $\frac{1}{2}$-$p_L$-fold array of external-port connectors 416, such as the set of dual-stacked RJ45 jacks, a $k_L$-fold array of leaf chips 602, an array of Phy chips 604 that connects the switch chip 602 to the physical medium (e.g., ethernet cables) attached to the external ports 416, a tailstock 606 and EMI fingerstock 608 that attenuate the passage of electromagnetic energy there through, tailstock mounting brackets 610, and cooling means 612 that includes, for example, the vapor chamber 614 and finned heatsink 616, which are both visible in FIG. 6D, but are both hidden on FIG. 6B to reveal the leaf chip 602. The particular cooling arrangement shown arises from the desire to place the leaf chip 602 as close as possible to the orthogonal receptacles 414 in order to minimize electrical path length in the leaf card 408. To cool the leaf chip in this position, the vapor chamber 614 is used to move the heat with low resistance from left to right, illustrated in FIG. 6D, thereby allowing good conduction to a broad area of the finned heat sink 616, particularly to the right end of the finned heat sink, where its fins are taller due to the leaf-card spreading angle $\Delta\theta$.

Figure 6E:
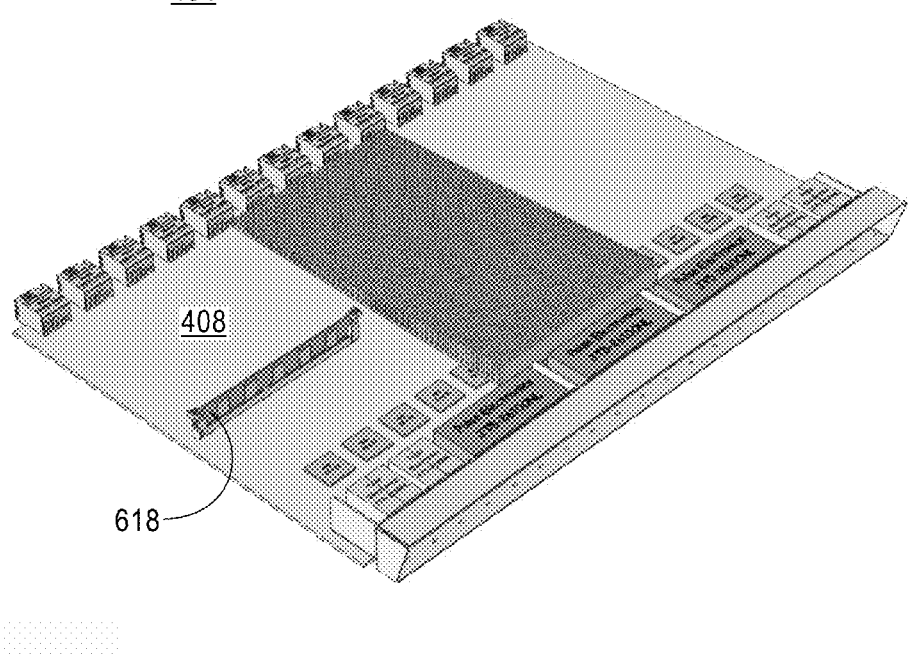

Referring now to FIG. 6E, the leaf-card assembly 404 may optionally comprise additional elements, such as the DIMM-card assembly 618.

Figure 6F:
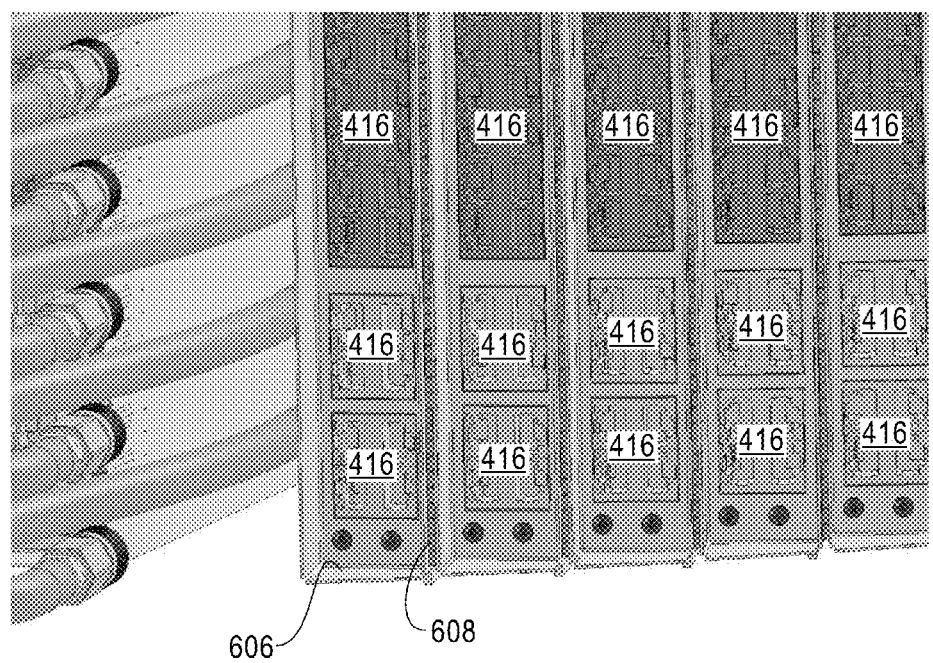

Referring now to FIG. 6F, a portion of the ½$p_L$-fold array of dual-stacked RJ45 connectors 416 are shown at the distal end of several leaf cards. Referring to FIGS. 4E, 6D, and 6F, the leaf-card spreading angle $\Delta\theta$, as well as the proximal-to-distal dimension W of the leaf card, is chosen to produce, at the distal edge 418, a leaf-card-to-leaf-card pitch that accommodates the dual-stacked RJ45 connectors 416 as well as EMI-containment hardware. The latter includes tailstock 606 and EMI-suppressing fingerstock 608.

Referring now to FIGS. 7A-7F, a core switch 700 includes the spine-and-leaf array 400 as well as mechanical and cooling infrastructure. As shown in FIG. 7A-7D, this infrastructure, located above and below the spine-and-leaf array 400, comprises a lower card-guide plate 702; an upper card-guide plate 704; a plurality of columns 706 each of which is affixed at a first end 708 to the lower card-guide plate 702 and is affixed at a second end 710 to the upper card-guide plate 704, thereby to hold the card-guide plates 702 and 704 a fixed distance apart; a supply-manifold assembly 712 for distributing liquid coolant to the liquid-cooled cold plates 510 of spine-card assemblies 402; a return-manifold assembly 716 for re-aggregating liquid coolant after it has flowed through cold plates 510; a leaf-air inlet plenum 718 into which flows a first airstream 720 whose purpose is to cool the leaf-card assemblies 404; a leaf-air outlet plenum 722 whose interior is maintained at a lower-than-ambient pressure by a centrifugal fan (i.e. "blower") 724 located in an exhaust chamber 726 that exhausts airstream 720; a liquid-to-air heat exchanger 728, illustrated in FIGS. 7B-7E, wherein heat is exchanged from liquid coolant to a second airstream 730; a plurality of axial fans 734; a pump 736; a shroud 738 to convey the second airstream 730; a first plumbing assembly 740 that conveys liquid coolant from an outlet of heat exchanger 728 to supply manifold 712; a second plumbing assembly 742 that conveys liquid coolant from return-manifold assembly 716 to pump 736; and a third plumbing assembly 744 that conveys liquid coolant from pump 736 to an inlet of heat exchanger 728. Leaf-air inlet plenum 718 is illustrated as opaque in FIG. 7A and transparent in FIGS. 7B-7E. Leaf-air outlet plenum 722 is illustrated as opaque in FIGS. 7A-7C and 7E and transparent in FIG. 7D. Exhaust chamber 726 is illustrated as opaque in FIGS. 7A-7B and transparent in FIGS. 7C-7E. Shroud 738 is illustrated as opaque in FIG. 7A and transparent in FIGS. 7B-7E.

Figure 7A:
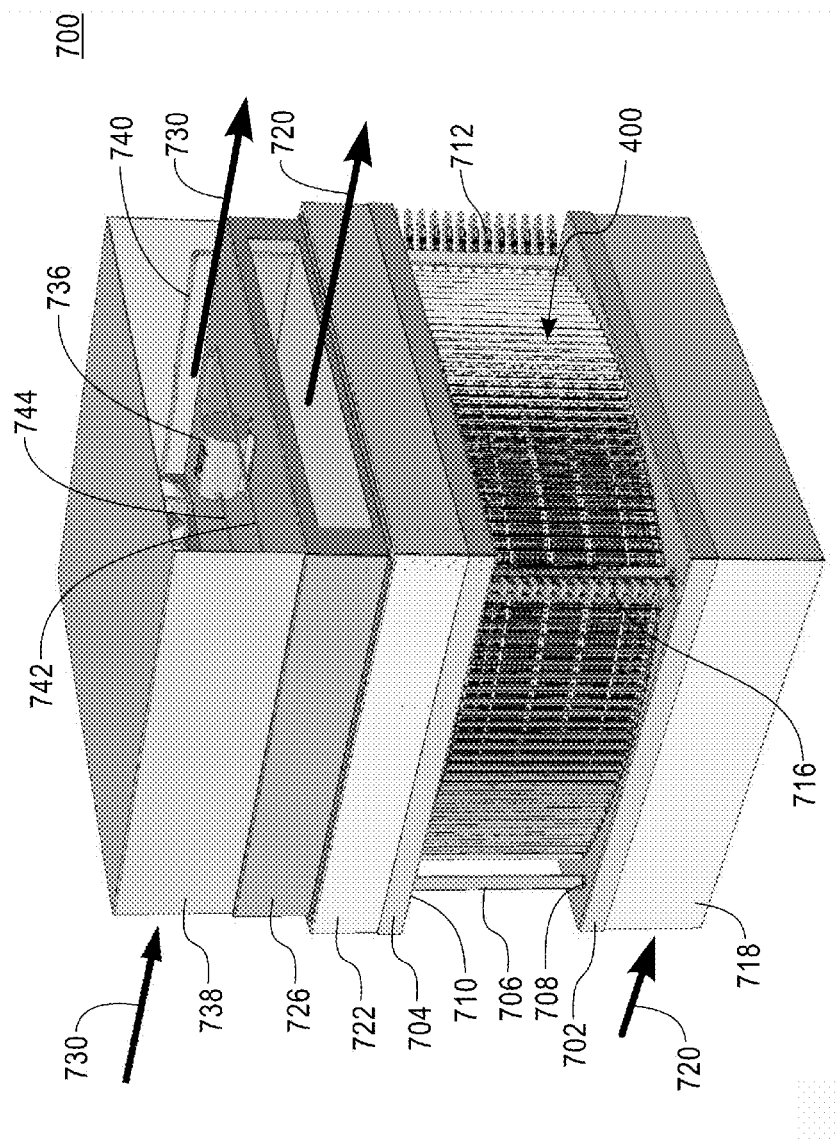
FIGS. 7A-7F are illustrations of spine-and-leaf array and a mechanical and cooling infrastructure, according to an embodiment.
Figure 7B:
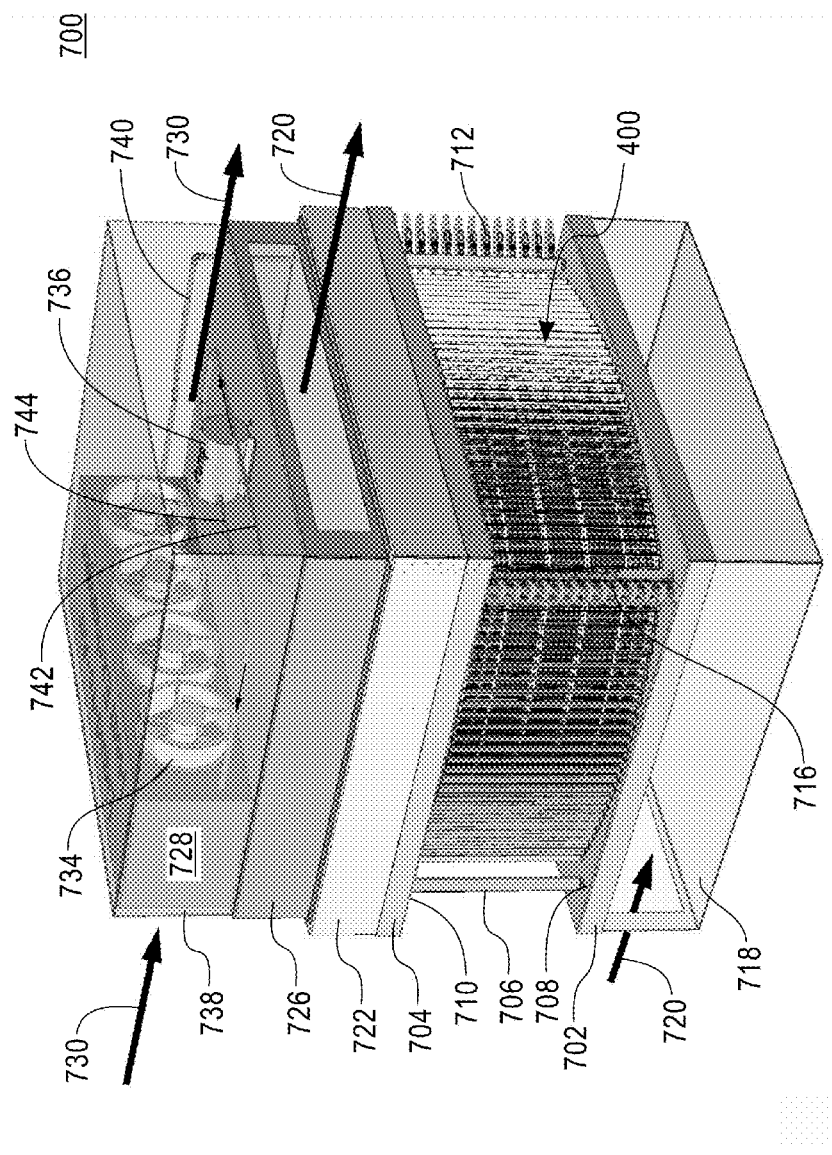
Figure 7C:
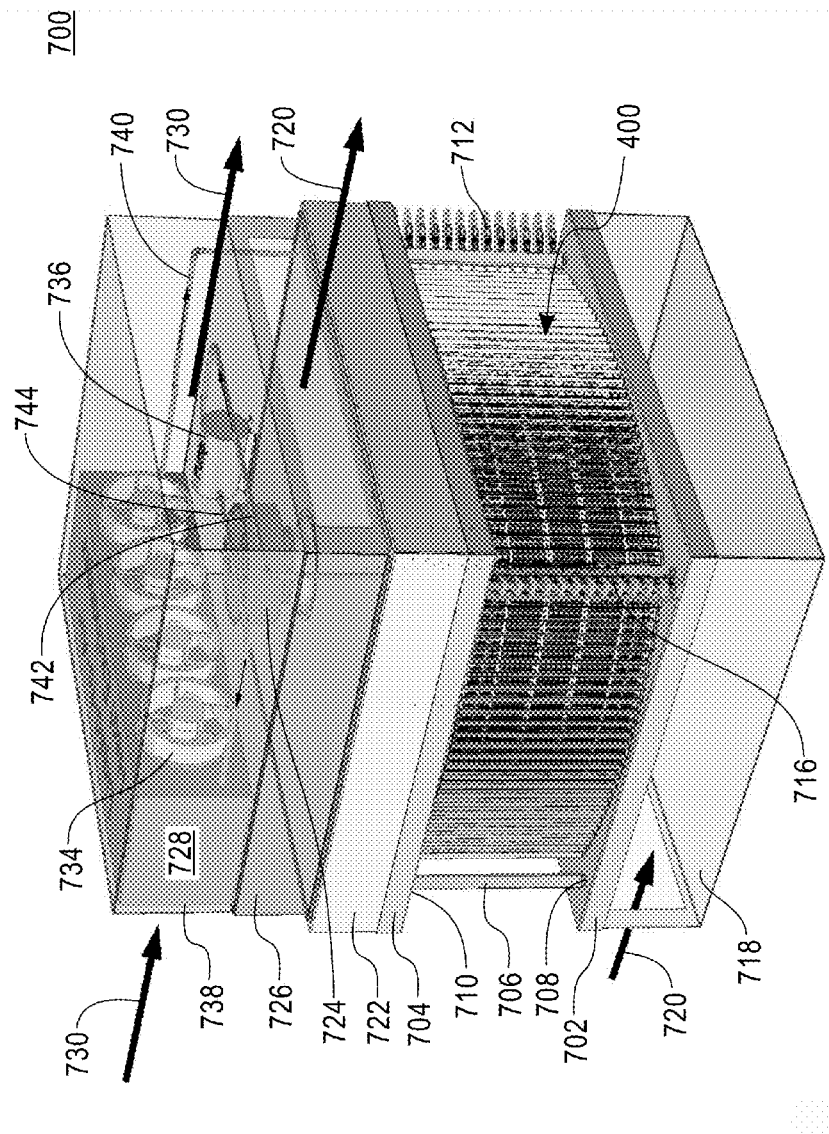
Figure 7D:
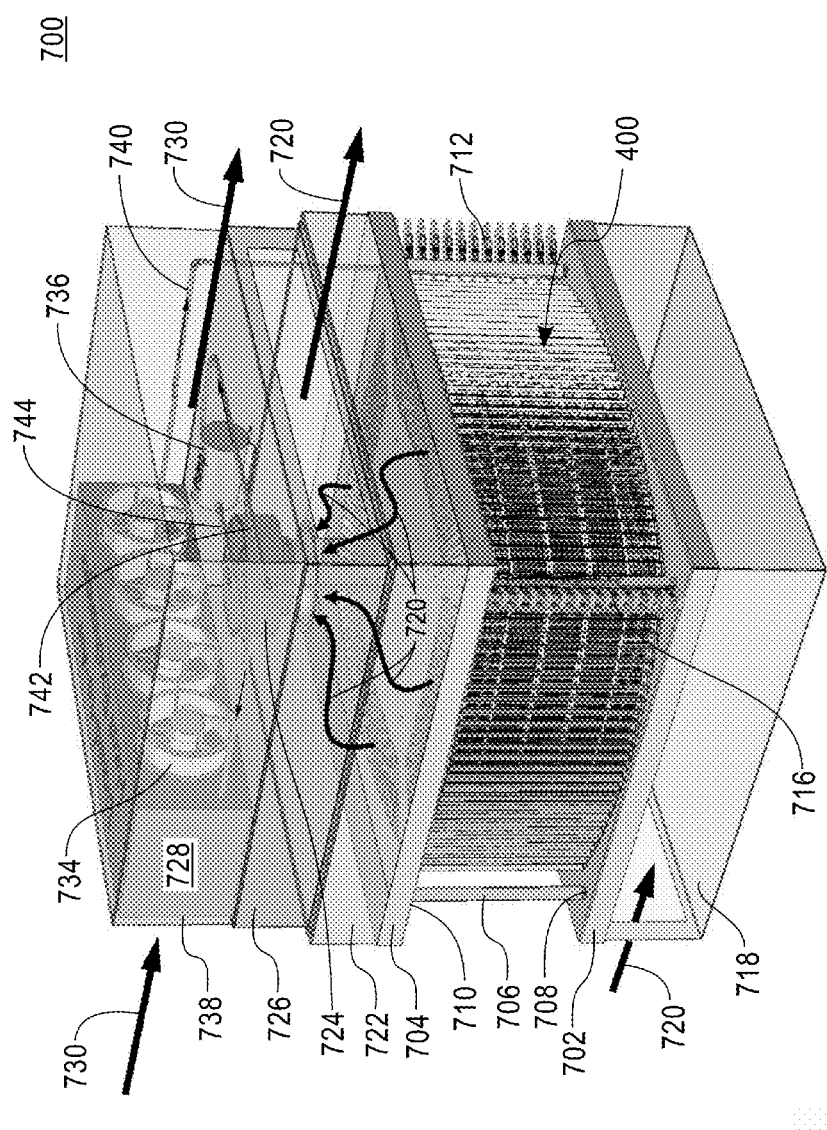
Figure 7E:
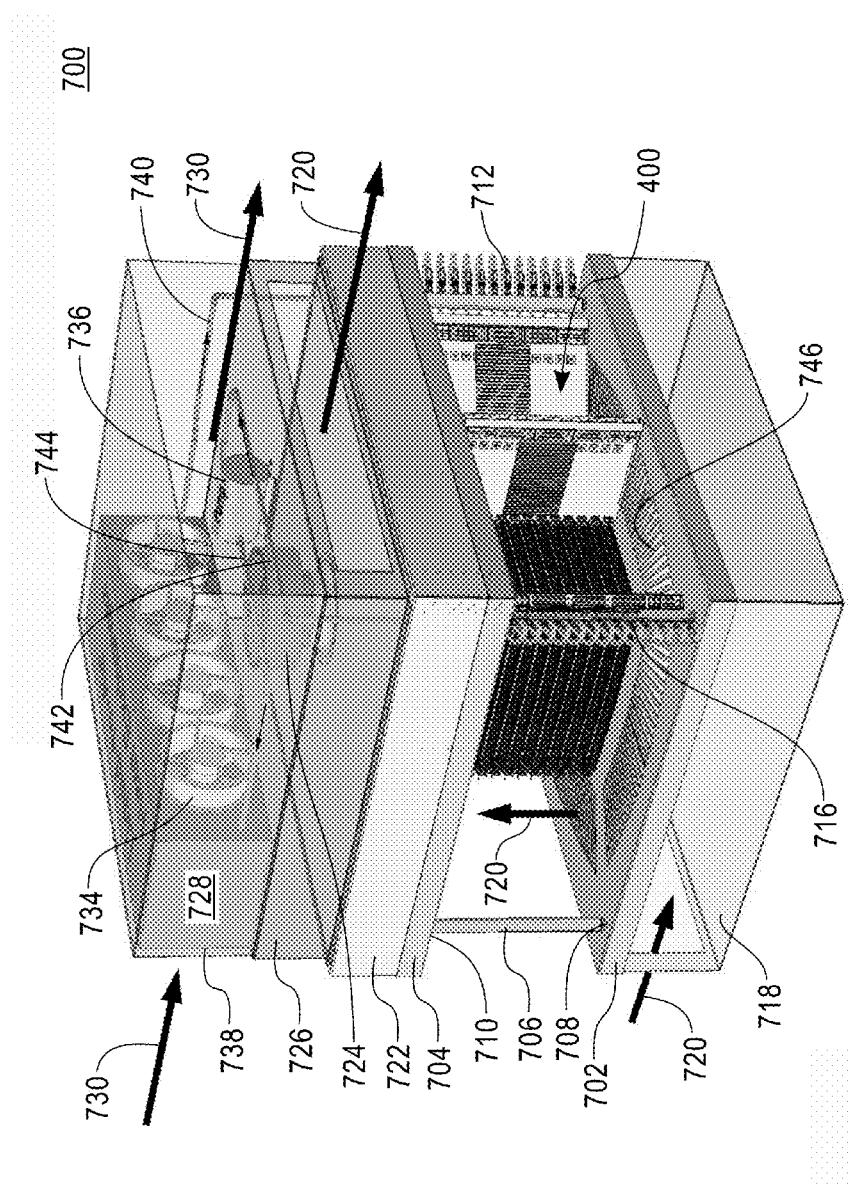

Referring now to FIG. 7E, in which some of the leaf-card assemblies are hidden, airstream 720 flows through perforations 746 in the lower card-guide plate 702. The vertical dimension of the leaf-air inlet plenum 718 may be large enough to insure that the flow through all perforations 746 is substantially equal; that is, enclosure 718 should act as a true plenum.

Referring now to FIG. 7D, airstream 720 likewise flows through perforations 748 in the upper card-guide plate 704.

The vertical dimension of the leaf-air outlet plenum 722 must be large enough to insure that the flow through all perforations 748 is substantially equal; that is, enclosure 718 should act as a true plenum.

Figure 7F:
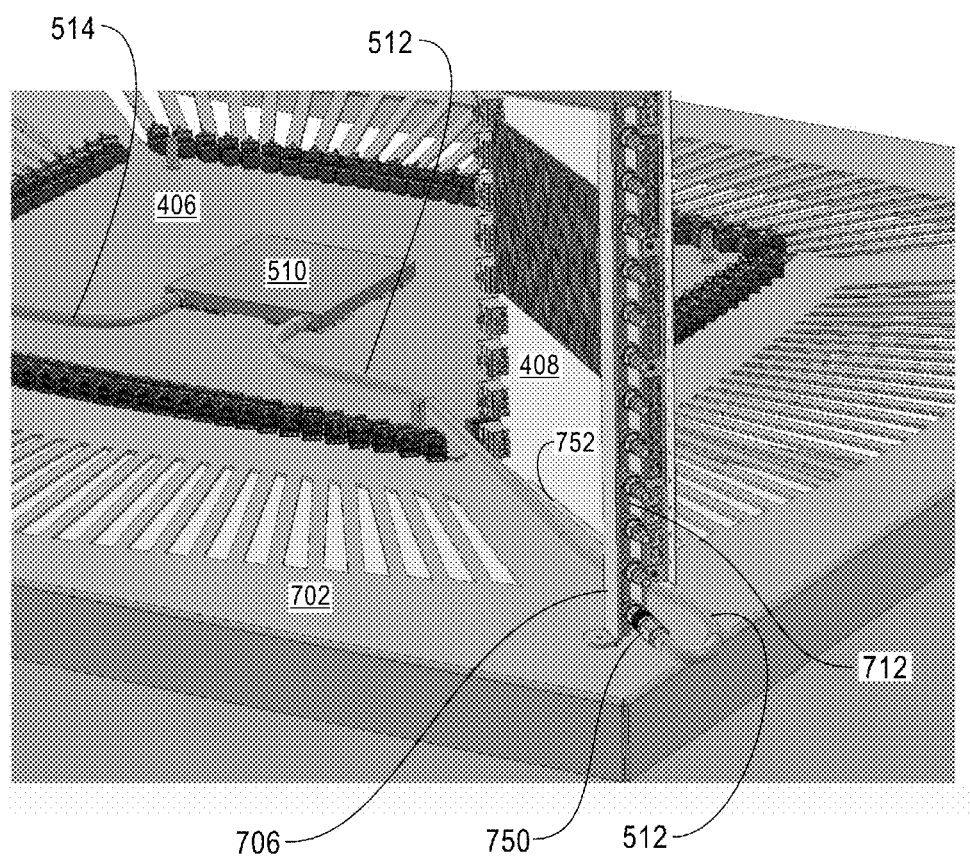

Referring now to FIG. 7F, in which all but one spine card 406 and one leaf card 408 are hidden, the supply manifold 712 is supported by one of the plurality of columns 706. Supply hose 512 connects to supply manifold 712 via a quick connect 750, and is routed to the liquid-cooled cold plate 510 using the vacant space at the corner of the spine card 406. Routing of the return hose 514 is similar.

The leaf card 408, upon insertion, is guided into position by two cards guides 752, one at the bottom, which is affixed to the lower card-guide plate 702, and the other at the top (not illustrated) which is affixed to the upper card-guide plate 704. In FIG. 7F, the lower card guides for hidden leaf cards are also hidden.

Figure 8A:
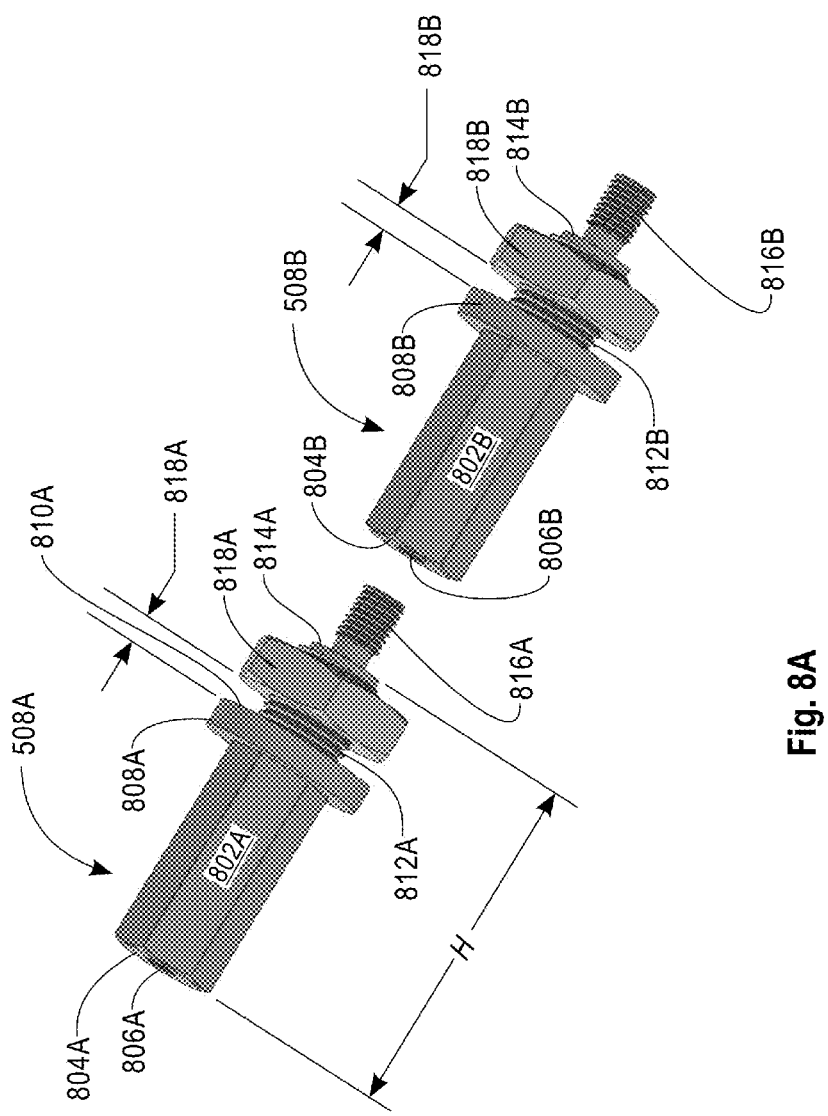
FIGS. 8A-8C are illustrations of a standoff structure, according to an embodiment.
Figure 8B:
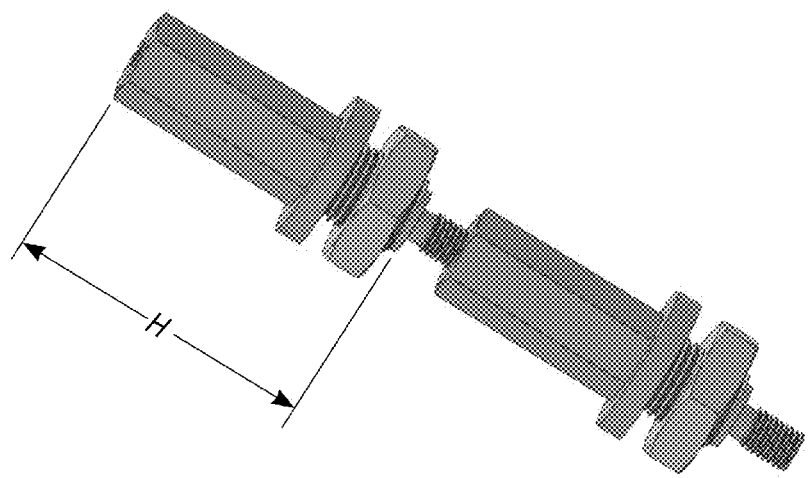
Figure 8C:
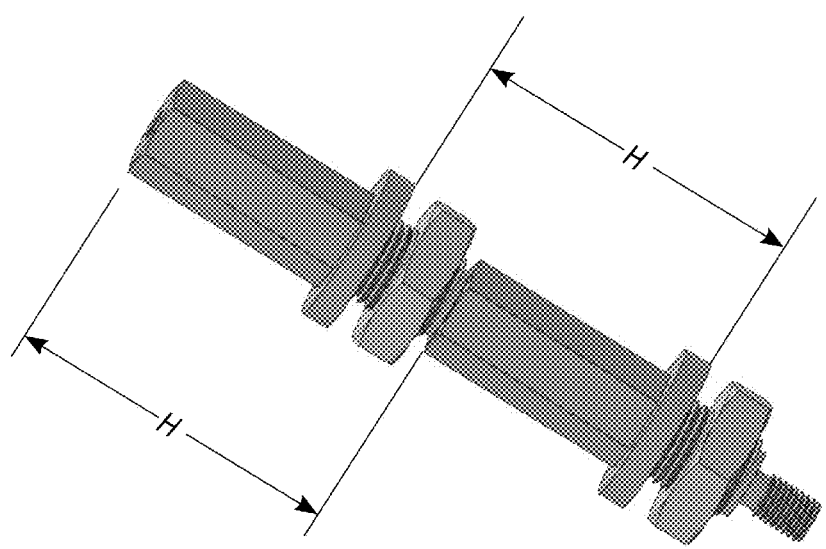

Referring now to FIGS. 8A-8C, precise location of each spine card in the z direction of coordinate system 410 (FIG. 4A) is assured, despite variability in PCB thickness, by a plurality of standoffs 508 previously shown on FIGS. 5A-5E. Two instances of standoff 508, denoted 508A and 508B, are shown on FIGS. 8A-8C; all reference numerals on the figures are accordingly decorated with suffix A or B, but are referred to herein without suffix. Each standoff 508 includes a shank 802 having a first end face 804 in which is cut a threaded hole 806; a flange 808 having a second end face 810; a first male-threaded section 812 having a third end face 814, where the outer diameter of section 812 is smaller than that of the flange 806; a second male-threaded portion 816 whose outer diameter is smaller than that of the first male-threaded portion 812, and whose thread mates with that of the threaded hole 806; and a nut 818 whose female thread mates with the male thread on the first male-threaded portion 812. In stacking the spine cards 408, a first spine card 408A is captured between end face 810A and nut 818A, a second spine card 408B is captured between end face 810B and nut 818B, and threaded portion 816A is threaded into hole 806B until end face 814A abuts end face 804B, as illustrated by the sequence shown in FIGS. 8A-8C. In FIG. 8C, end faces 814A and 806B are abutted. Presuming that all standoffs are substantially identical, the distance between end faces 810A and 810B, which defines the pitch of the spine cards, is accurately controlled to be equal to a length H that is the distance between end faces 804A and 814A of standoff 508A.

Figure 9E:

Referring now to FIGS. 9A-9E, assembling the stack of spine assemblies 402 using standoffs 508 is accomplished upside down. First, a first spine-card assembly 402A, complete with first-card standoffs 508A, is turned upside down, as illustrated in FIG. 9A, exposing, at the site of each first-card standoff 508A, the second male-threaded portion thereof, 816A. Second, as illustrated in FIG. 9B, at each instance of a first-card standoff 508A, a second-card standoff 508B is threaded on tightly, such that, referring to FIG. 8A, surface 804B of standoff 508B abuts surface 814A of standoff 508A. Third, as illustrated in FIG. 9C, a second spine-card assembly 402B is placed upside down upon the first threaded portions 812B of standoffs 508B. Fourth, as illustrated in FIG. 9D, nuts 818B are tightened securely onto threaded portions 812B, thereby capturing the second spine-card assembly 402B between nuts 818B and surfaces 810B. The second, third, and fourth steps recited above are then repeated for each remaining spine-card assembly that needs to be added to the stack. Finally, the stack is turned right side up. The result is shown in FIG. 9E, where the stack was built in the following order: A, B, C, D, E.

Figure 10A:
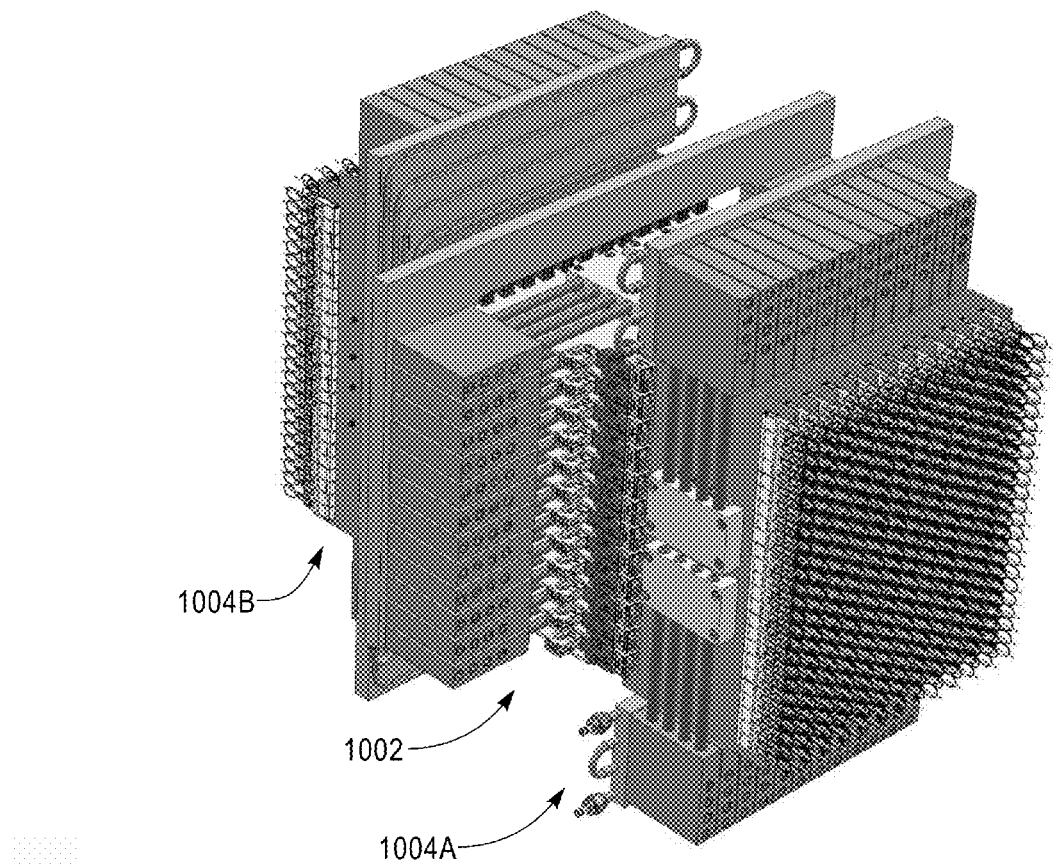

Referring now to FIGS. 10A and 10B, an alternative embodiment 1000 of a high-density, fail-in-place switch for computer and data networks comprises a liquid-cooled spine-card array 1002, a first instance 1004A of a liquid-cooled leaf-card array 1004 connected to the front of the spine-card array 1002, and a second instance 1004B of the leaf-card array 1004 connected to the rear of the spine-card array 1002. FIG. 10A shows the switch 1000 assembled; FIG. 10B shows it exploded into the three components 1002, 1004A, and 1004B.

Figure 11A:
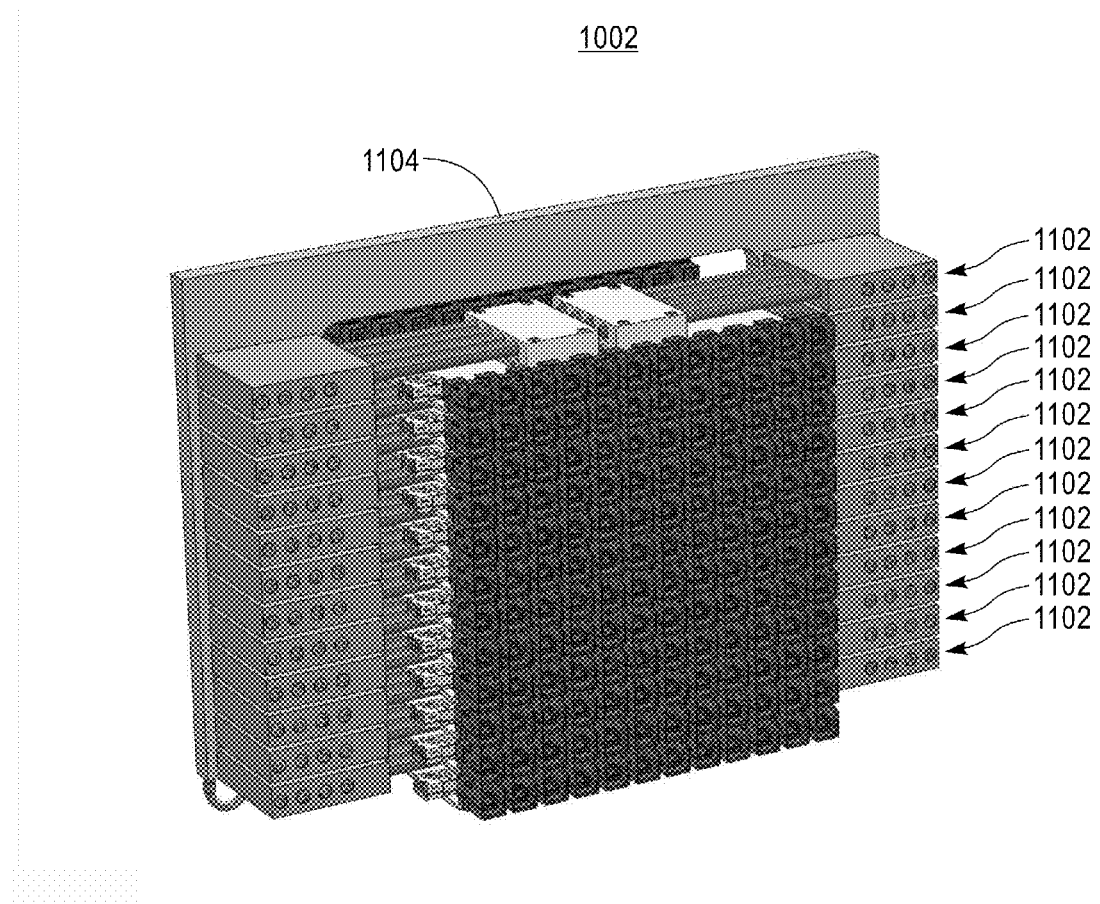
FIGS. 11A-14B are illustrations of components of the spine-and-leaf array, according to an alternative embodiment.
Figure 11B:
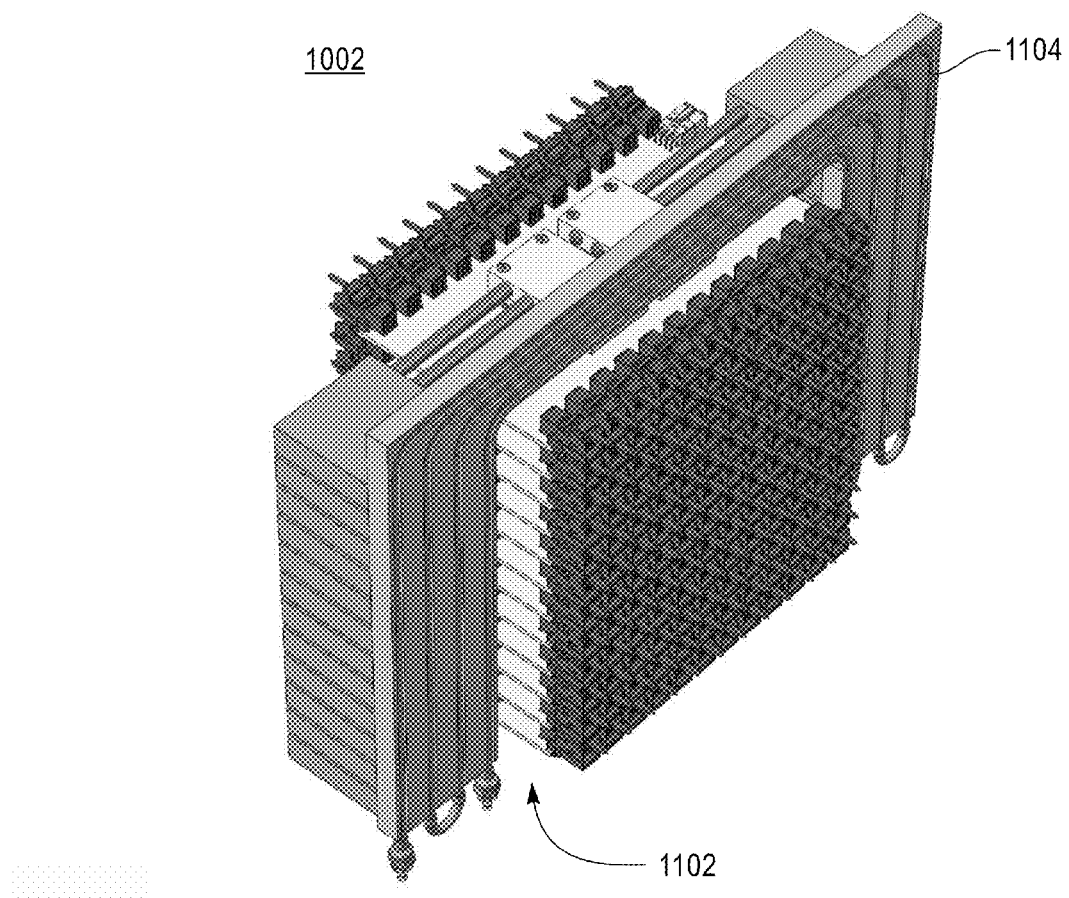

Referring now to FIGS. 11A and 11B, the spine-card array 1002 includes a plurality of $n_S$ spine-card assemblies 1102 ($n_S=12$ is shown) and a liquid-cooled cold plate 1104 that cools the spine-card assemblies. FIG. 11A is a front view of array 1002; FIG. 11B is a rear view. The cold plate 1104, shown to best advantage in FIG. 11B, comprises an aluminum plate and embedded copper tubes, as is well known in the art. Other details of spine-card cooling will be discussed presently.

Figure 12A:
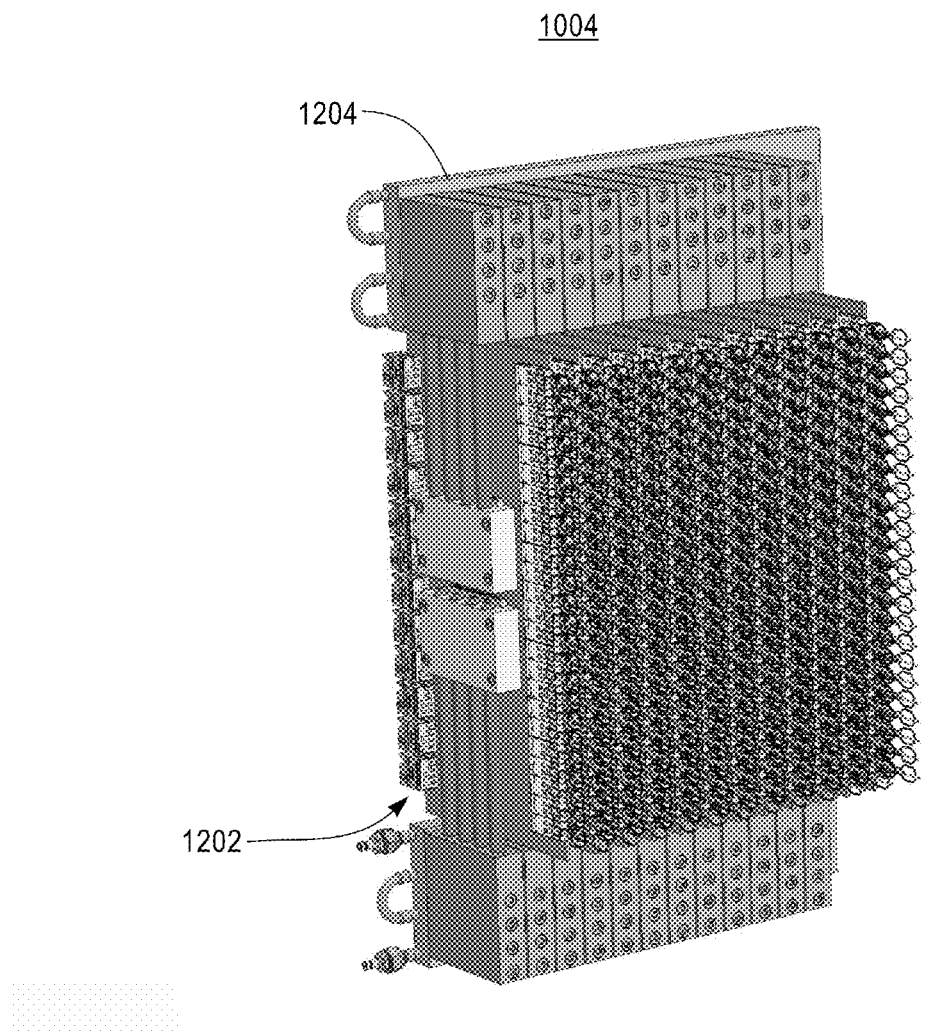
Figure 12B:
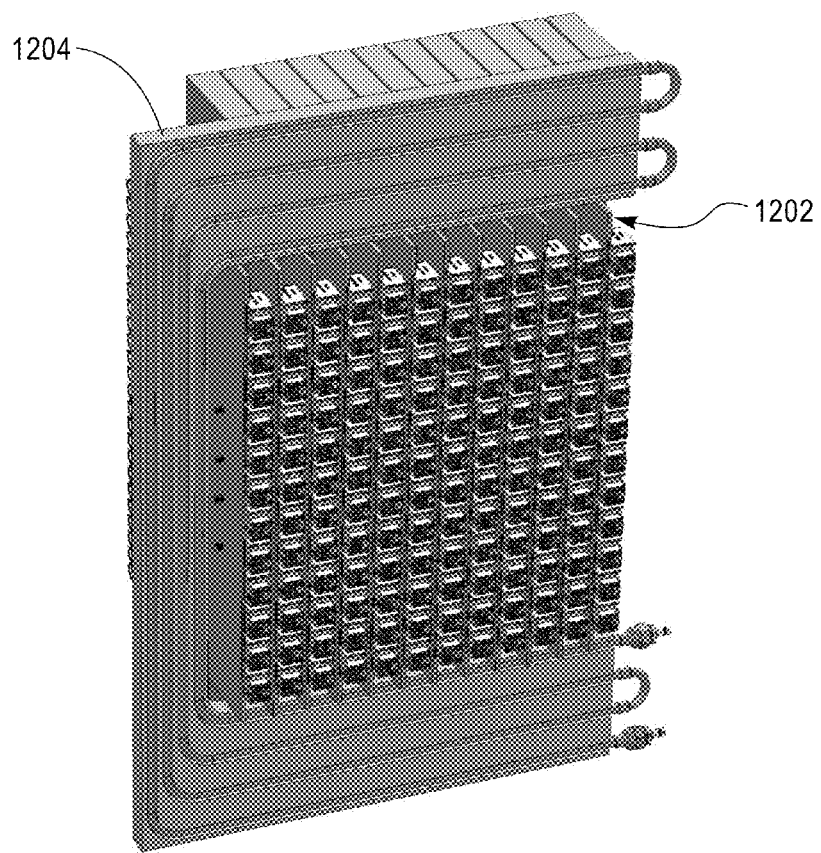

Referring now to FIGS. 12A and 12B, the leaf-card array 1004 includes a plurality of $n_L/2$ leaf-card assemblies 1202 ($n_L/2=12$ is shown) and a liquid-cooled cold plate 1204 that cools the leaf-card assemblies. FIG. 12A is a front view of array 1004; FIG. 12B is a rear view. The cold plate 1204, shown to best advantage in FIG. 12B, is constructed in the same manner as cold plate 1104. Other details of leaf-card cooling will be discussed presently.

Figure 13A:
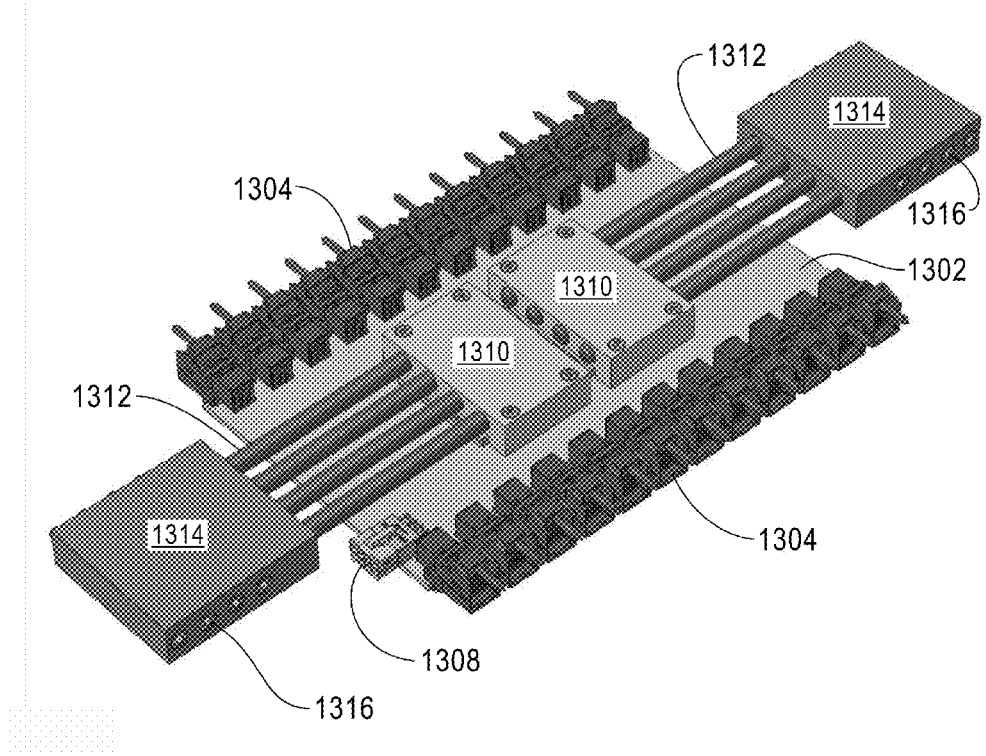
Figure 13B:
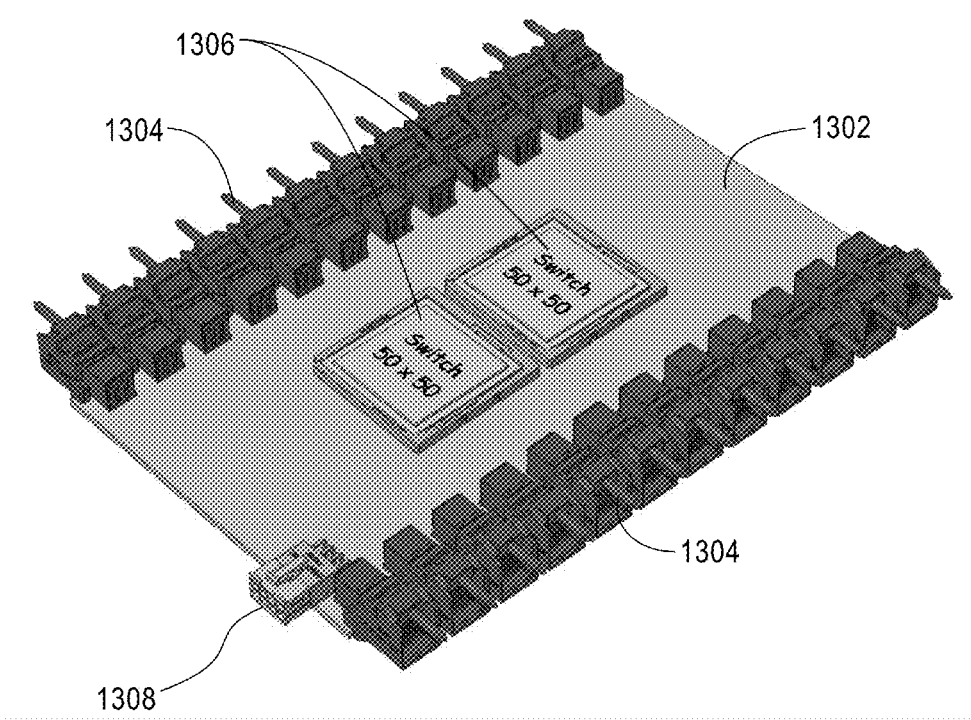

Referring now to FIGS. 13A and 13B, a spine-card assembly 1102 includes a spine card 1302; a plurality of orthogonal headers 1304 arrayed on two opposing edges of the spine card to convey electrical signals between the spine card and leaf cards; a set of $k_S$ spine chips 1306 ($k_S=2$ is shown)(FIG. 13B); a power connector 1308 to convey power to the spine card; and for each spine chip, a cooling assembly that comprises a heat spreader 1310, a set of spine heat pipes 1312, and a cold block 1314. A first end of each heat pipe 1312 is embedded in the heat spreader 1310, and a second end of each heat pipe is embedded in the cold block 1314. Consequently, heat is efficiently conveyed from the heat spreader 1310 to the cold block 1314, in a manner well known in the art of heat-pipe cooling. In this heat-pipe system, the heat spreader 1310 serves as the evaporator and the cold block 1314 serves as the condenser. Each cold block 1314 comprises an array of fasteners 1316, typically threaded fasteners, that removably attach the cold block 1314 to the cold plate 1104 (see FIG. 11A). The cooling assemblies are hidden in FIG. 13B to reveal the switch chips 1306.

Figure 14A:
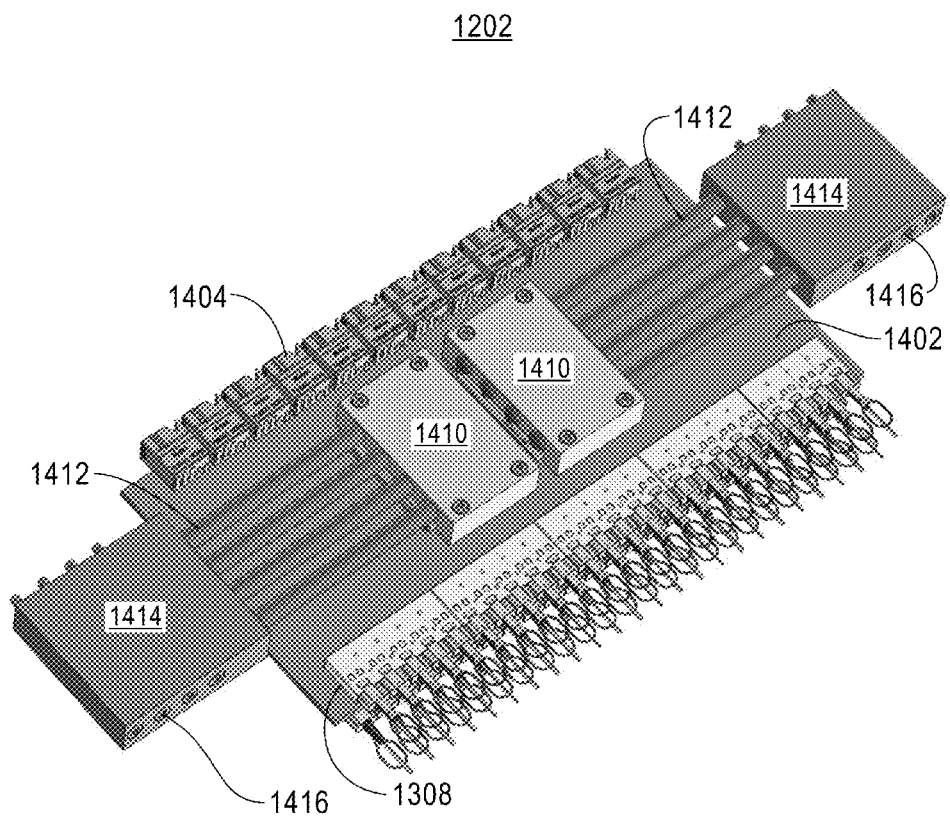
Figure 14B:
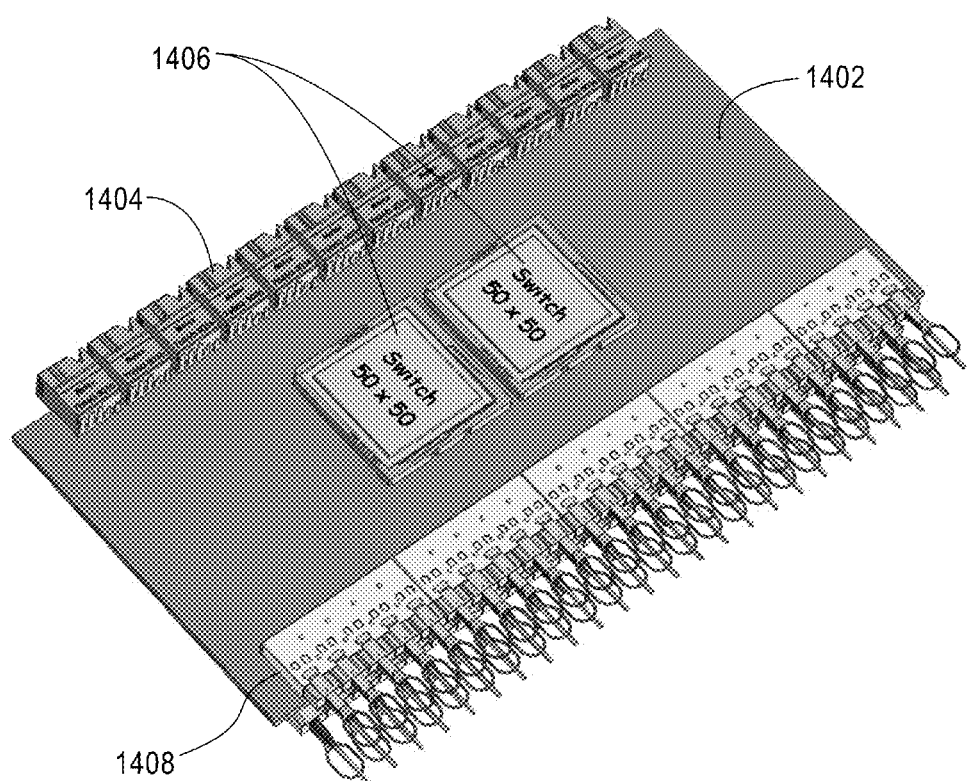

Referring now to FIGS. 14A and 14B, a leaf-card assembly 1202 comprises a leaf card 1402; a plurality of orthogonal receptacles 1404 arrayed along a first edge of the leaf card 1402, one of which connects to each spine card via mating headers 1304; a set of $k_L$ leaf chips 1406 ($k_L=2$ is shown) (FIG. 14B); a set of $p_L/2$ externally facing port connectors 1408 ($p_L/2=48$ is shown) arrayed along a second edge of the leaf card 1402 that is opposite the first edge; and for each leaf chip, a cooling assembly that comprises a heat spreader 1410, a set of leaf heat pipes 1412, and a cold block 1414. A first end of each heat pipe 1412 is embedded in the heat spreader 1410, and a second end of each heat pipe is embedded in the cold block 1414. Heat is efficiently conveyed from the heat spreader 1410 to the cold block 1414, in a manner well known in the art of heat-pipe cooling. In this heat-pipe system, the heat spreader 1410 serves as the evaporator and the cold block 1414 serves as the condenser. Each cold block 1414 comprises an array of fasteners 1416, typically threaded fasteners, that removably attach the cold block 1414 to the cold plate 1204 (see FIG. 12A). The cooling assemblies are hidden in FIG. 14B to reveal the switch chips 1406. The leaf-card assembly 1202 may additionally comprise cooling elements (not illustrated) for the port connectors 1408 in cases where the cables terminating in these connectors produce heat, as in the case of active optical cables.

The fail-in-place strategy disclosed herein provides, for computer and data networks, a switch having a large number of externally facing ports. This is achieved by making an improved use of the perimeter of the spine cards for connection to leaf cards. Accessibility of spine cards is thereby sacrificed, precluding the easy repair thereof. This tradeoff may be advantageous because the two-level, spine-leaf topology typically used in switches, is inherently redundant, the fail-in-place strategy disclosed herein causes only minor performance penalties, yet allows the number of externally facing ports to increase significantly, by as much as a factor of four compared to prior art, thereby significantly increasing the number of computing and storage elements that may be interconnected without an undesirable cascading of switches.

While the description above contains much specificity, these should not be construed as limitations on the scope, but rather as exemplifications of preferred embodiments thereof. Many other variations are possible, such as, for example, the number of switch chips on the spine and leaf cards may vary, the number of spine and leaf boards may vary, the connections between spine and leaf boards may be optical as well as electrical, and cooling of the chips may be accomplished in a variety of ways. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A network switch comprising: a plurality of spine cards each comprising a liquid cooling plate in direct contact with one or more spine chips, the plurality of spine cards are stacked vertically one on top of another and separated by a predetermined space; a plurality of leaf cards each comprising one or more leaf chips in direct contact with a heat sink, the plurality of leaf cards are perpendicular to and circumferentially arrayed around the stack of spine cards, the leaf chips of each leaf card are electrically connected to the spine chips of each spine card; an inlet air plenum arranged directly below the stack of spine cards to direct an air flow across the heat sinks of the leaf cards in a direction perpendicular to the spine cards; an outlet air plenum for receiving the air flow from across the leaf cards; a supply piping connecting each liquid cooling plate to a heat exchanger via a supply manifold, wherein the supply piping is routed through a space between adjacent leaf cards at a first corner of the stack of spine cards; and a return piping connecting each liquid cooling plate to the heat exchanger via a return manifold, wherein the return piping is routed through a space between adjacent leaf cards at a second corner of the stack of spine cards.

2. The structure of claim 1, wherein each leaf card is removably coupled to all of the spine cards.

3. The structure of claim 1, wherein an orthogonal connector connects all the spine cards to each of the leaf cards.

4. The structure of claim 1, wherein the leaf cards surround the stack of spine cards on all four sides, and all the leaf cards along each side of the stack of spine cards are separated from each other by a space at all four corners of the stack of spine cards.

5. The structure according to claim 1, further comprising: lower card guide plate comprising perforations and guiding features corresponding with each of the plurality of leaf cards, the lower guide plate being positioned between the stack of spine cards and the air inlet plenum; and upper card guide plate comprising perforations and guiding features corresponding with each of the plurality of leaf cards, the upper guide plate being positioned between the stack of spine cards and the air outlet plenum.

\* \* \* \* \*